US009924618B2

(12) United States Patent
Kuriki et al.

(10) Patent No.: US 9,924,618 B2
(45) Date of Patent: Mar. 20, 2018

(54) CONDUCTIVE FILM AND DISPLAY APPARATUS PROVIDED WITH SAME

(71) Applicant: FUJIFILM Corporation, Minato-ku, Tokyo (JP)

(72) Inventors: Tadashi Kuriki, Ashigarakami-gun (JP); Kazuchika Iwami, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 60 days.

(21) Appl. No.: 13/939,607

(22) Filed: Jul. 11, 2013

(65) Prior Publication Data
US 2013/0294037 A1 Nov. 7, 2013

Related U.S. Application Data

(63) Continuation of application No. PCT/JP2012/050929, filed on Jan. 18, 2012.

(30) Foreign Application Priority Data

Jan. 18, 2011 (JP) ................................. 2011-007675
Jan. 18, 2011 (JP) ................................. 2011-007678
Jan. 18, 2011 (JP) ................................. 2011-007685
May 10, 2011 (JP) ................................. 2011-105374

(51) Int. Cl.
*H05K 9/00* (2006.01)
*G06F 3/044* (2006.01)

(52) U.S. Cl.
CPC .............. *H05K 9/00* (2013.01); *G06F 3/044* (2013.01); *H05K 9/0096* (2013.01); *G06F 2203/04112* (2013.01)

(58) Field of Classification Search
CPC ......... H05K 9/00; H05K 9/0096; G06F 3/044
USPC .......................................................... 361/748
See application file for complete search history.

(56) References Cited

U.S. PATENT DOCUMENTS

| 4,971,848 | A  | * | 11/1990 | Ruelle et al. ................... 428/38 |
| 7,129,935 | B2 | * | 10/2006 | Mackey ........................ 345/174 |
| 7,663,607 | B2 | * | 2/2010 | Hotelling et al. ............. 345/173 |
| 8,717,332 | B2 | * | 5/2014 | Kono et al. ................... 345/174 |

(Continued)

FOREIGN PATENT DOCUMENTS

| CN | 101120626 A | 2/2008 |
| CN | 101604039 A | 12/2009 |

(Continued)

OTHER PUBLICATIONS

International Search Report of PCT/JP2012/050929 dated Apr. 17, 2012, 5 pages in Japanese and English English.
Rejection of the Application, dated Mar. 3, 2015, issued in corresponding JP Application No. 2011-105374, 4 pages in English and Japanese.

(Continued)

*Primary Examiner* — William H Mayo, III
*Assistant Examiner* — Hiram E Gonzalez
(74) *Attorney, Agent, or Firm* — Sughrue Mion, PLLC

(57) ABSTRACT

The present invention discloses a conductive film and a display apparatus provided with the conductive film. A conductive film is disposed on a display panel of a display apparatus, and has a base body, and a conductive section formed on one of the main surfaces of the base body. The conductive section has a mesh pattern composed of fine metal lines, and the fine metal lines have a tilt of 30-44° with respect to the alignment direction of pixels of the display apparatus.

23 Claims, 21 Drawing Sheets

(56) References Cited

U.S. PATENT DOCUMENTS

| | | | |
|---|---|---|---|
| 2009/0073085 A1 | 3/2009 | Saneto et al. | |
| 2009/0133922 A1 | 5/2009 | Okazaki et al. | |
| 2009/0310212 A1 | 12/2009 | Shin et al. | |
| 2011/0102370 A1 | 5/2011 | Kono et al. | |
| 2011/0291966 A1 | 12/2011 | Takao et al. | |
| 2012/0062472 A1* | 3/2012 | Yilmaz | 345/173 |

FOREIGN PATENT DOCUMENTS

| | | | |
|---|---|---|---|
| JP | 2000-066614 A | 3/2000 | |
| JP | 2002223095 A | 8/2002 | |
| JP | 2004055566 A | 2/2004 | |
| JP | 2004192093 A | 7/2004 | |
| JP | 2006302997 A | 11/2006 | |
| JP | 2008-282924 A | 11/2008 | |
| JP | 2009-094467 A | 4/2009 | |
| JP | 2009-259003 A | 11/2009 | |
| JP | 2009259826 A | 11/2009 | |
| JP | 2010-039537 A | 2/2010 | |
| JP | 2010-108877 A | 5/2010 | |
| JP | 2010108878 A | 5/2010 | |
| JP | 2011248722 A | 12/2011 | |
| WO | 2010/013679 A | 2/2010 | |

OTHER PUBLICATIONS

Rejection of the Application, dated Oct. 6, 2015, issued in related JP Application No. 2012-007926, 4 pages in English and Japanese.

Rejection of the Application, dated Oct. 6, 2015, issued in related JP Application No. 2012-008067, 10 pages in English and Japanese.

First Notification of Reasons for Refusal, dispatched Nov. 4, 2015, issued in corresponding CN Application No. 201280005744.1, 11 pages in English and Chinese.

Communication dated Jun. 7, 2016, from the Japanese Patent Office in counterpart application No. 2012-008067.

Communication dated Jun. 7, 2016, from the Japanese Patent Office in counterpart application No. 2012-007926.

Notice of Final Rejection, dispatched Nov. 21, 2016, in corresponding Korean Application No. 10-2016-7005217, 6 pages in English and Korean.

Communication dated Feb. 21, 2017 from the State Intellectual Property Office of the P.R.C. in counterpart Application No. 201280005744.1.

Rejection of the Application, dispatched May 2, 2017, issued in related JP Application No. 2012-008067, 19 pages in English and Japanese.

Appeal Decision, dispatched Oct. 31, 2017, in Appeal No. 2016-013392, 17 pages in English and Japanese.

Notification, dated Sep. 20, 2017, in related JP Application No. 2017-0022497, 20 pages in English and Japanese.

\* cited by examiner

FIG. 1
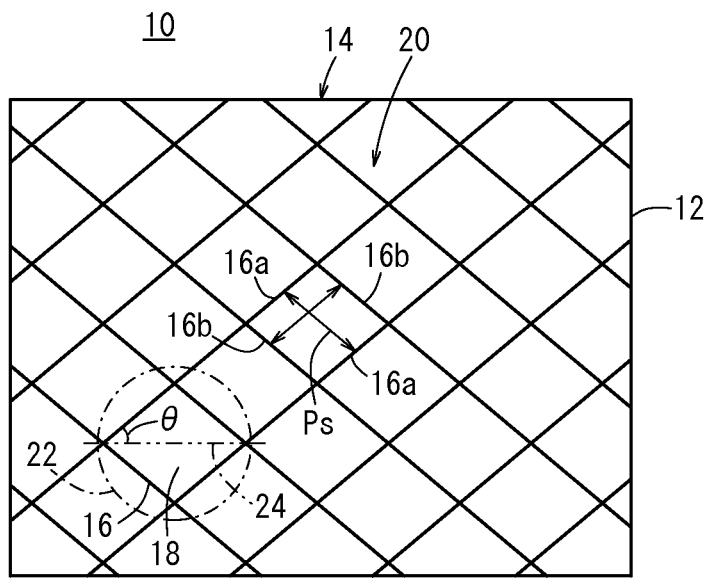
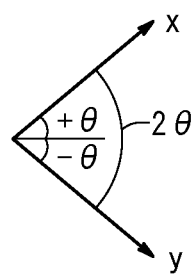

FIG. 4
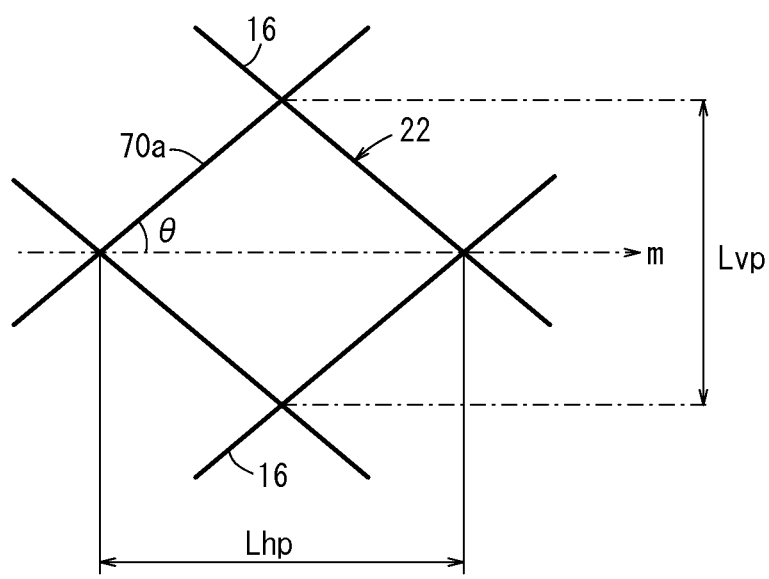

FIG. 5
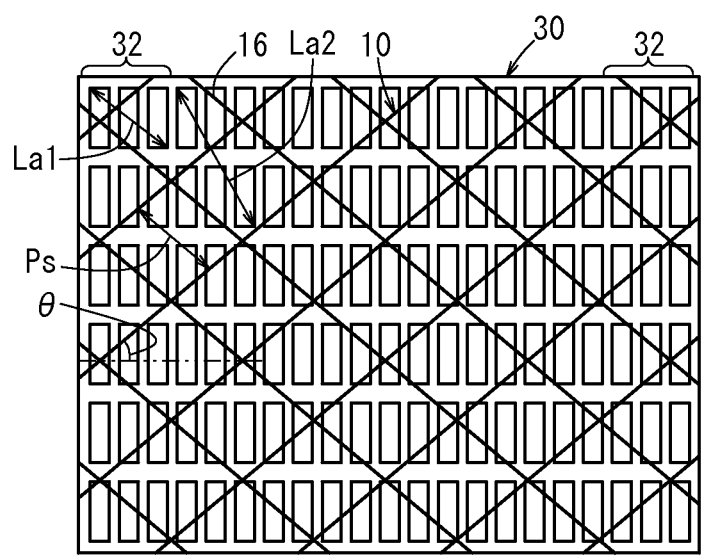
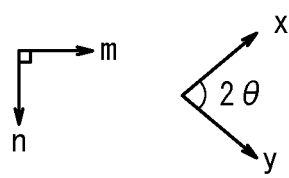

FIG. 11
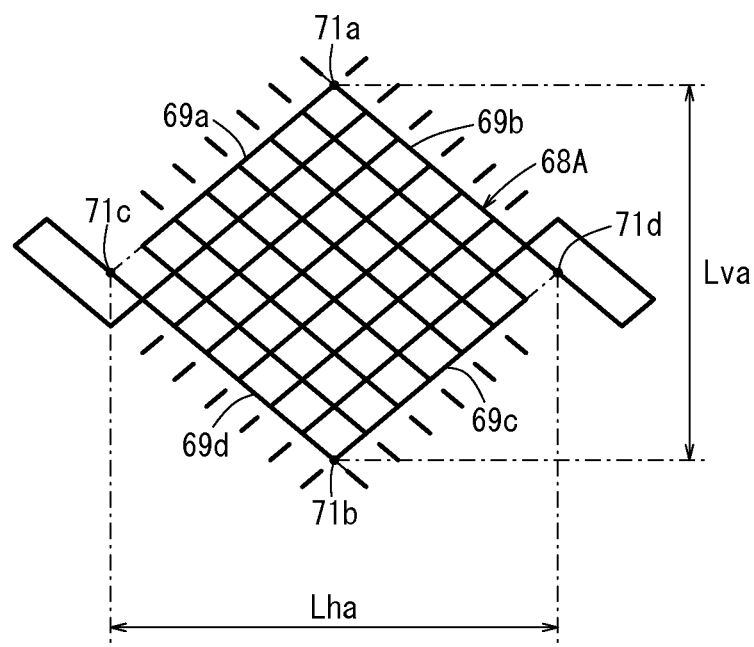
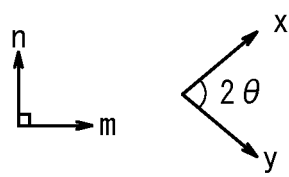

FIG. 12
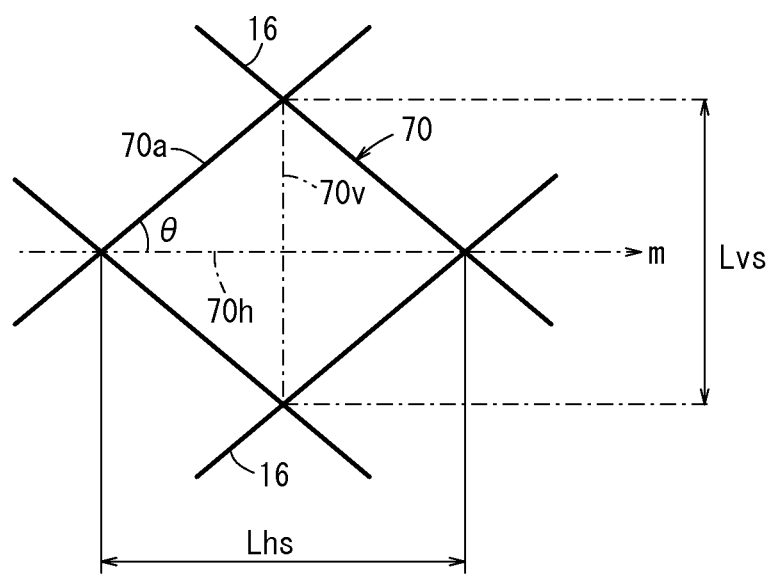

FIG. 13
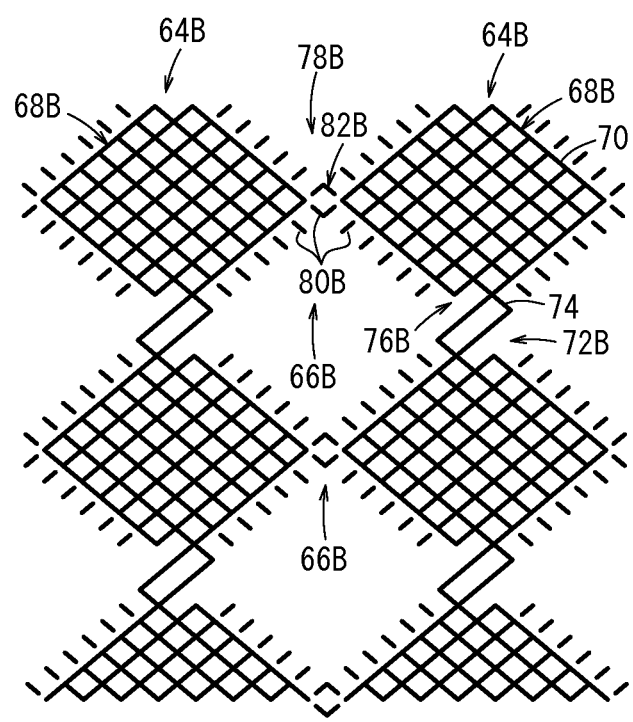
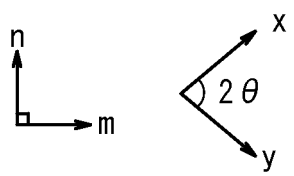

FIG. 20
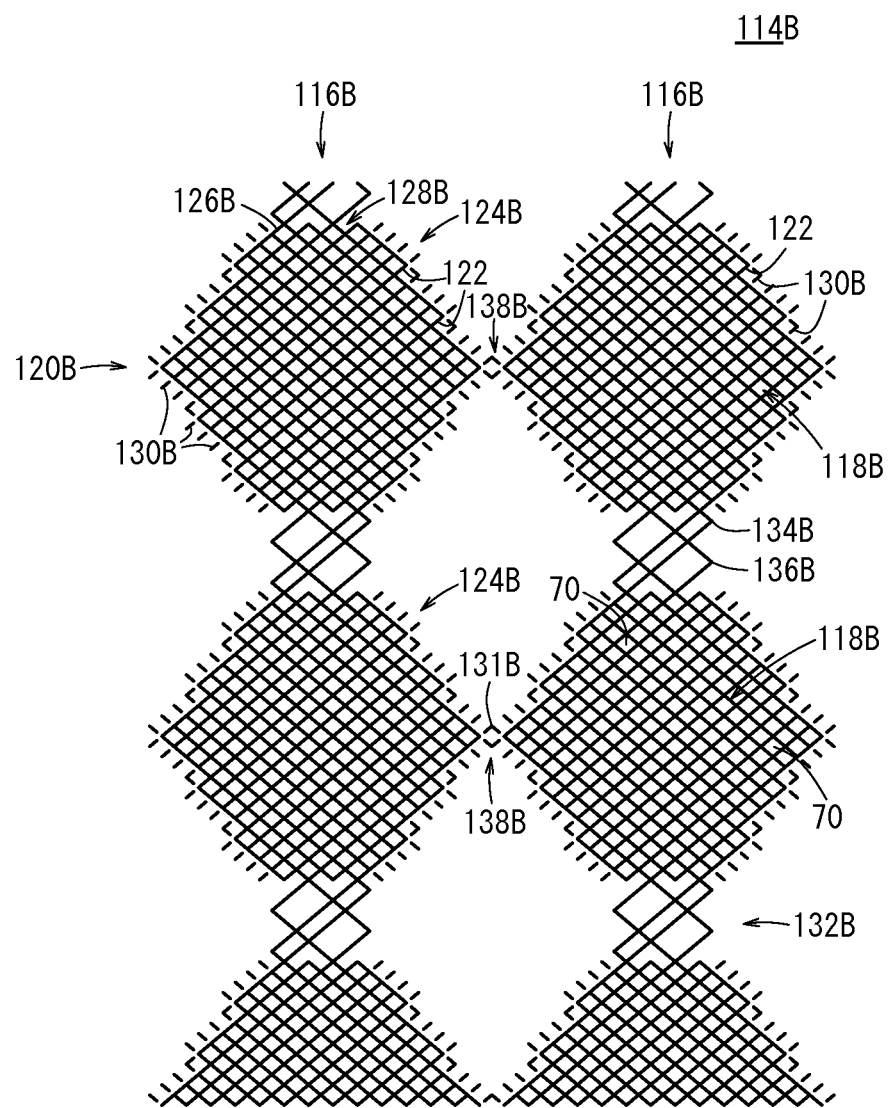
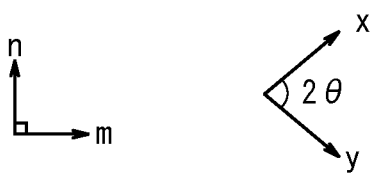

CONDUCTIVE FILM AND DISPLAY APPARATUS PROVIDED WITH SAME

CROSS-REFERENCE TO RELATED APPLICATIONS AND PRIORITY CLAIMS

This application is a Continuation of International Application No. PCT/JP2012/050929 filed on Jan. 18, 2012, which was published under PCT Article 21(2) in Japanese, which is based upon and claims the benefit of priority from Japanese Patent Applications No. 2011-007675 filed on Jan. 18, 2011, No. 2011-007678 filed on Jan. 18, 2011, No. 2011-007685 filed on Jan. 18, 2011 and No. 2011-105374 filed on May 10, 2011, the contents all of which are incorporated herein by reference.

TECHNICAL FIELD

The present invention relates to a conductive film and a display device (apparatus) using the same.

BACKGROUND ART

Conductive films, to be disposed on a display panel of a display device, include conductive electromagnetic-shielding films (see, e.g., Japanese Laid-Open Patent Publication Nos. 2008-282924 and 2009-094467), conductive touch panel films (see, e.g., Japanese Laid-Open Patent Publication No. 2010-108877), and the like.

In such conductive films, a lattice pattern is formed on a transparent substrate. In Japanese Laid-Open Patent Publication No. 2008-282924, a moire preventing part is arranged adjacent to an intersection of a lattice pattern. In Japanese Laid-Open Patent Publication No. 2009-094467, a moire preventing film having a moire preventing part is attached to an electromagnetic-shielding film having a lattice pattern to prevent moire generation.

SUMMARY OF INVENTION

An object of the present invention is to provide a conductive film, which can have a simple structure different from the structures of the above patent documents, can be attached to a display panel of a common display device while preventing moire generation, and can be produced with high yield, and to provide a display device having the conductive film.

[1] A conductive film according to a first aspect of the present invention, comprising a substrate and a conductive part disposed on one main surface thereof, wherein the conductive part contains two or more conductive patterns composed of a thin metal wire, the conductive patterns extend in a first direction and are arranged in a second direction perpendicular to the first direction, the conductive patterns each contain a combination of two or more lattices, the lattices each have a rhombic shape, and at least one side of each lattice is at an angle of 30° to 60° with respect to the first direction.

[2] In the first aspect, it is preferred that at least one side of each lattice is at an angle of 30° to 44° with respect to the first direction.

[3] In the first aspect, it is preferred that at least one side of each lattice is at an angle of 32° to 39° with respect to the first direction.

[4] In the first aspect, it is preferred that at least one side of each lattice is at an angle of 46° to 60° with respect to the first direction.

[5] In the first aspect, it is preferred that at least one side of each lattice is at an angle of 51° to 58° with respect to the first direction.

[6] In the first aspect, the conductive patterns may each contain two or more sensing portions connected in series in the first direction, and the sensing portions may each contain a combination of two or more lattices.

[7] A conductive film according to a second aspect of the present invention, comprising a substrate, a first conductive part disposed on one main surface of the substrate, and a second conductive part disposed on the other main surface of the substrate, wherein the first conductive part contains two or more first conductive patterns, the first conductive patterns extend in a first direction and are arranged in a second direction perpendicular to the first direction, the second conductive part contains two or more second conductive patterns, the second conductive patterns extend in the second direction and are arranged in the first direction, the first and second conductive patterns each contain a combination of two or more lattices, the lattices each have a rhombic shape, and at least one side of each lattice is at an angle of 30° to 60° with respect to the first direction.

[8] In the second aspect, the first conductive patterns may each contain two or more first sensing portions connected in series in the first direction, the second conductive patterns may each contain two or more second sensing portions connected in series in the second direction, and the first and second sensing portions may each contain a combination of two or more lattices.

[9] A conductive film according to a third aspect of the present invention, comprising a substrate and a conductive part disposed on one main surface of the substrate, wherein the conductive part contains a mesh pattern having an opening, and the opening has a rhombic shape having angles of 60° to 120°.

[10] A conductive film according to a fourth aspect of the present invention, comprising a substrate and a conductive part disposed on one main surface of the substrate, wherein the conductive part contains two or more conductive patterns composed of a thin metal wire, the conductive patterns extend in a first direction and are arranged in a second direction perpendicular to the first direction, the conductive patterns each contain two or more sensing portions connected in the first direction, and each of the sensing portions has a second direction length Lv and a first direction length Lh, and satisfies the condition of 0.57<Lv/Lh<1.74.

[11] In the fourth aspect, it is preferred that each sensing portion satisfies the condition of 0.57<Lv/Lh<1.00.

[12] A conductive film according to a fifth aspect of the present invention, comprising a substrate, a first conductive part disposed on one main surface of the substrate, and a second conductive part disposed on the other main surface of the substrate, wherein the first conductive part contains two or more first conductive patterns, the first conductive patterns extend in a first direction and are arranged in a second direction perpendicular to the first direction, the second conductive part contains two or more second conductive patterns, the second conductive patterns extend in the second direction and are arranged in the first direction, the first conductive patterns each contain two or more first sensing portions connected in the first direction, the second conductive patterns each contain two or more second sensing portions connected in the second direction, each of the first sensing portions has a second direction length Lva and a first direction length Lha, and satisfies the condition of 0.57<Lva/Lha<1.74, and each of the second sensing portions has a second direction length Lvb and a first direction length Lhb, and satisfies the condition of 0.57<Lvb/Lhb<1.74.

[13] In the fifth aspect, it is preferred that each first sensing portion satisfies the condition of 0.57<Lva/Lha<1.00, and each second sensing portion satisfies the condition of 0.57<Lvb/Lhb<1.00.

[14] In the fourth or fifth aspect, it is preferred that the sensing portions each contain a plurality of lattices, and each lattice has a second direction length Lvs and a first direction length Lhs and satisfies the condition of 0.57<Lvs/Lhs<1.74.

[15] A conductive film according to a sixth aspect of the present invention, comprising a substrate and a conductive part disposed on one main surface of the substrate, wherein the conductive part contains a mesh pattern having an opening, the opening has a rhombic shape, and the rhombic shape has one diagonal line length Lvp and the other diagonal line length Lhp and satisfies the condition of 0.57<Lvp/Lhp<1.74.

[16] A display device according to a seventh aspect of the present invention, comprising a display panel and thereon a conductive film, wherein the conductive film contains a conductive part having a mesh pattern composed of a thin metal wire, and the thin metal wire is at an angle of 30° to 44° with respect to an arrangement direction of pixels in the display device.

[17] In the seventh aspect, it is preferred that the thin metal wire is at an angle of 32° to 39° with respect to the arrangement direction of the pixels in the display device.

In general, a conductive film is required to obtain a display device with an electromagnetic-shielding function, a touch panel function, or the like. Conventional conductive films having a mesh pattern or the like may cause moire on the display device. In contrast, the conductive film of the present invention can be used on the display panel while preventing the moire generation. Furthermore, the conductive film of the present invention can be produced with high yield.

In addition, the display device of the present invention can be used as a low-resistance, electromagnetic-shielding or touch-panel device. The display device can be used as a touch-panel display without moire generation.

BRIEF DESCRIPTION OF DRAWINGS

FIG. 1 is a plan view of a conductive film according to a first embodiment;

FIG. 4 is a view for illustrating a size (an aspect ratio) of a mesh shape (a rhombus);

FIG. 5 is a partially omitted plan view of the conductive film disposed on the display device;

FIG. 11 is a view for illustrating a size (an aspect ratio) of a first large lattice;

FIG. 12 is a view for illustrating a size (an aspect ratio) of the small lattice;

FIG. 13 is a plan view of a pattern example of a second conductive part formed on a second conductive film according to the first embodiment;

FIG. 20 is a plan view of a pattern example of a second conductive part formed on a second conductive film according to the second embodiment.

DESCRIPTION OF EMBODIMENTS

Several embodiments of the conductive film and the display device containing the conductive film of the present invention will be described below with reference to FIGS. 1 to 21. It should be noted that, in this description, a numeric range of "A to B" includes both the numeric values A and B as the lower limit and upper limit values.

A first embodiment will be described below with reference to FIGS. 1 to 16.

Figure 2:
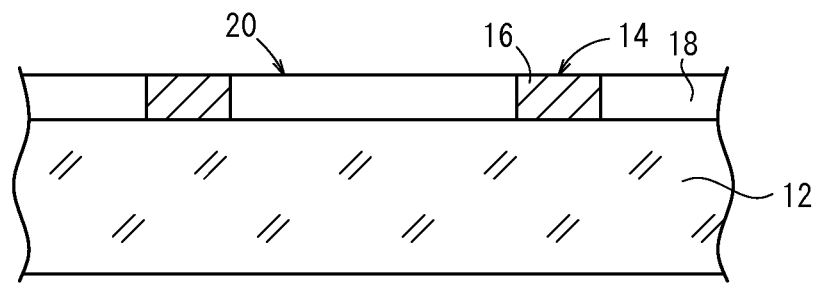
FIG. 2 is a partially omitted cross-sectional view of the conductive film.

As shown in FIGS. 1 and 2, a conductive film 10 according to the first embodiment has a transparent substrate 12 (see FIG. 2) and a conductive part 14 formed on one main surface of the transparent substrate 12. The conductive part 14 has a mesh pattern 20 containing thin wires of a metal (hereinafter referred to as the thin metal wires 16) and openings 18. For example, the thin metal wires 16 contain gold (Au), silver (Ag), or copper (Cu).

Specifically, in the conductive part 14, a plurality of first thin metal wires 16a and a plurality of second thin metal wires 16b are crossed to form the mesh pattern 20, the first thin metal wires 16a extend in a first oblique direction (an x direction shown in FIG. 1) and are arranged in a second oblique direction (a y direction shown in FIG. 1) at a pitch Ps, and the second thin metal wires 16b extend in the second oblique direction and are arranged in the first oblique direction at the pitch Ps. In this case, the first oblique direction is at an angle of +30° to +60° with respect to a reference direction (e.g. a horizontal direction), and the second oblique direction is at an angle of −30° to −60° with respect to the reference direction. Consequently, in the mesh pattern 20, each of mesh shapes 22, which is a combination of one opening 18 and four thin metal wires 16 surrounding the one opening 18, is a rhombic shape having vertex angles of 60° to 120°.

Figure 3:
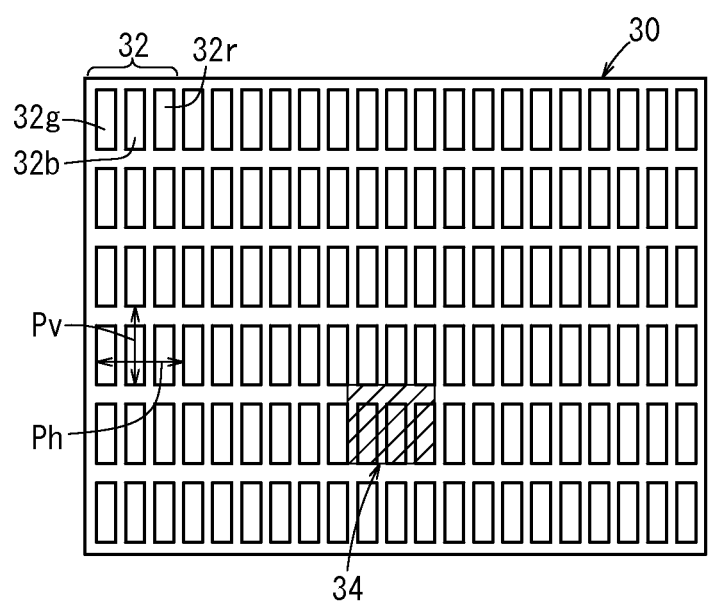
FIG. 3 is a partially omitted plan view of a pixel array in a display device, on which the conductive film is disposed.

The conductive film 10 can be used as an electromagnetic-shielding film of a display device 30 shown in FIG. 3, a conductive film of a touch panel, or the like. Examples of such display devices 30 include liquid crystal displays, plasma displays, organic EL displays, and inorganic EL displays.

The pitch Ps (hereinafter referred to also as the thin wire pitch Ps) may be selected within a range of 100 to 400 μm. The line width of the thin metal wire 16 may be 30 μm or less. In a case where the conductive film 10 is used as the electromagnetic-shielding film, the line width of the thin metal wire 16 is preferably 1 to 20 μm, more preferably 1 to 9 μm, further preferably 2 to 7 μm. In a case where the conductive film 10 is used as the conductive touch panel film, the line width of the thin metal wire 16 is preferably 0.1 to 15 μm, more preferably 1 to 9 μm, further preferably 2 to 7 μm.

The rhombic mesh shape 22 has two narrow angles of the four vertex angles, and half of each narrow angle is 30° to 44°. Thus, in a case where an imaginary line 24 extends in the opening 18 in the horizontal direction and connects a plurality of intersection points in the mesh pattern 20, an angle θ (an oblique angle θ) between the imaginary line 24 and the first thin metal wire 16a is 30° to 44°.

As shown with partial omission in FIG. 3, a plurality of pixels 32 are arranged in a matrix in the display device 30. One pixel 32 contains three subpixels (a red subpixel 32r, a green subpixel 32g, and a blue subpixel 32b), which are arranged in the horizontal direction. Each subpixel has a rectangular shape extending in the vertical direction. The arrangement pitch of the pixels 32 in the horizontal direction (the horizontal pixel pitch Ph) and the arrangement pitch of the pixels 32 in the vertical direction (the vertical pixel pitch Pv) are approximately equal to each other. Thus, a combination of one pixel 32 and a black matrix surrounding the pixel 32 (a shaded region 34) forms a square shape. Each pixel 32 does not have an aspect ratio of 1, and has a horizontal (lateral) length larger than the vertical (longitudinal) length.

The size of the rhombus of the mesh shape 22 will be described below with reference to FIG. 4. In the rhombus, when one diagonal line extending in the vertical direction has a length Lvp and the other diagonal line extending in the horizontal direction has a length Lhp, the size, i.e. the aspect ratio (Lvp/Lhp), of the rhombus satisfies the condition of 0.57<Lvp/Lhp<1.74.

In a case where the pixels 32 are arranged in the horizontal direction in the display device 30 (see FIG. 3), to which a touch panel 50 is attached, the aspect ratio (Lvp/Lhp) of the rhombus satisfies the condition of 0.57<Lvp/Lhp<1.00 or 1.00<Lvp/Lhp<1.74, and more preferably satisfies the condition of 0.62<Lvp/Lhp<0.81 or 1.23<Lvp/Lhp<1.61.

As shown in FIG. 5, in a case where the conductive film 10 is disposed on a display panel of the display device 30 having such a pixel array, the thin metal wire 16 forms a certain oblique angle θ with the horizontal arrangement direction (the m direction) of the pixels 32 in the display device 30. As shown in FIG. 1, the imaginary line 24 extends in the opening 18 in the horizontal direction and connects a plurality of the intersection points in the mesh pattern 20, and the angle θ between the imaginary line 24 and the first thin metal wire 16a is 30° to 60°, preferably 30° to 44°. Therefore, as shown in FIG. 4, the thin metal wire 16 is angled at 30° to 60°, preferably 30° to 44°, with respect to the horizontal arrangement direction (the m direction) of the pixels 32 in the display device 30. The thin wire pitch Ps of the conductive film 10 is approximately equal or close to the diagonal length La1 of one pixel 32 (or the diagonal length La2 of two adjacent pixels 32 arranged in the vertical direction) in the display device 30. Furthermore, the arrangement direction of the thin metal wires 16 in the conductive film 10 is approximately equal or close to the direction of the diagonal line of one pixel 32 (or the diagonal line of two adjacent pixels 32 arranged in the vertical direction) in the display device 30. Consequently, the arrangement period difference between the pixels 32 and the thin metal wires 16 can be reduced to prevent moire generation.

For example, in a case where the conductive film 10 is used as the electromagnetic-shielding film, the conductive film 10 is disposed on the display panel of the display device 30. In this case, as described above, the arrangement period difference between the pixels 32 and the thin metal wires 16 can be reduced to prevent the moire generation. In addition, since the thin metal wires 16 in the mesh pattern 20 has a pitch Ps of 100 to 400 μm and a line width of 30 μm or less, the electromagnetic-shielding film can exhibit both of a high electromagnetic-shielding property and a high light transmittance.

A display device having a touch panel such as a projected capacitive touch panel will be described below with reference to FIGS. 6 to 16.

Figure 6:
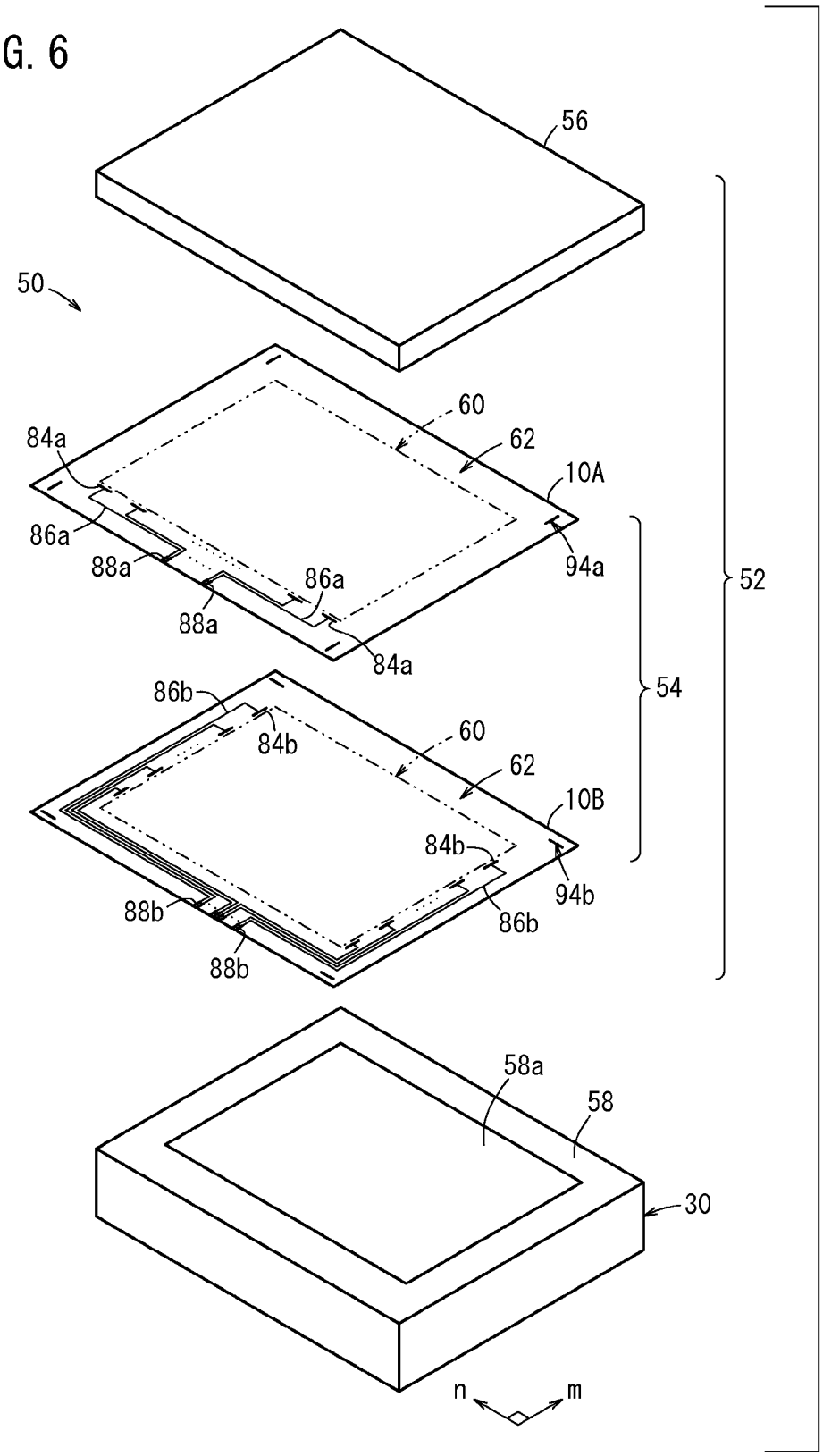
FIG. 6 is an exploded perspective view of a touch panel having a conductive film stack containing the conductive film of the first embodiment (a first conductive film stack)
Figure 7:
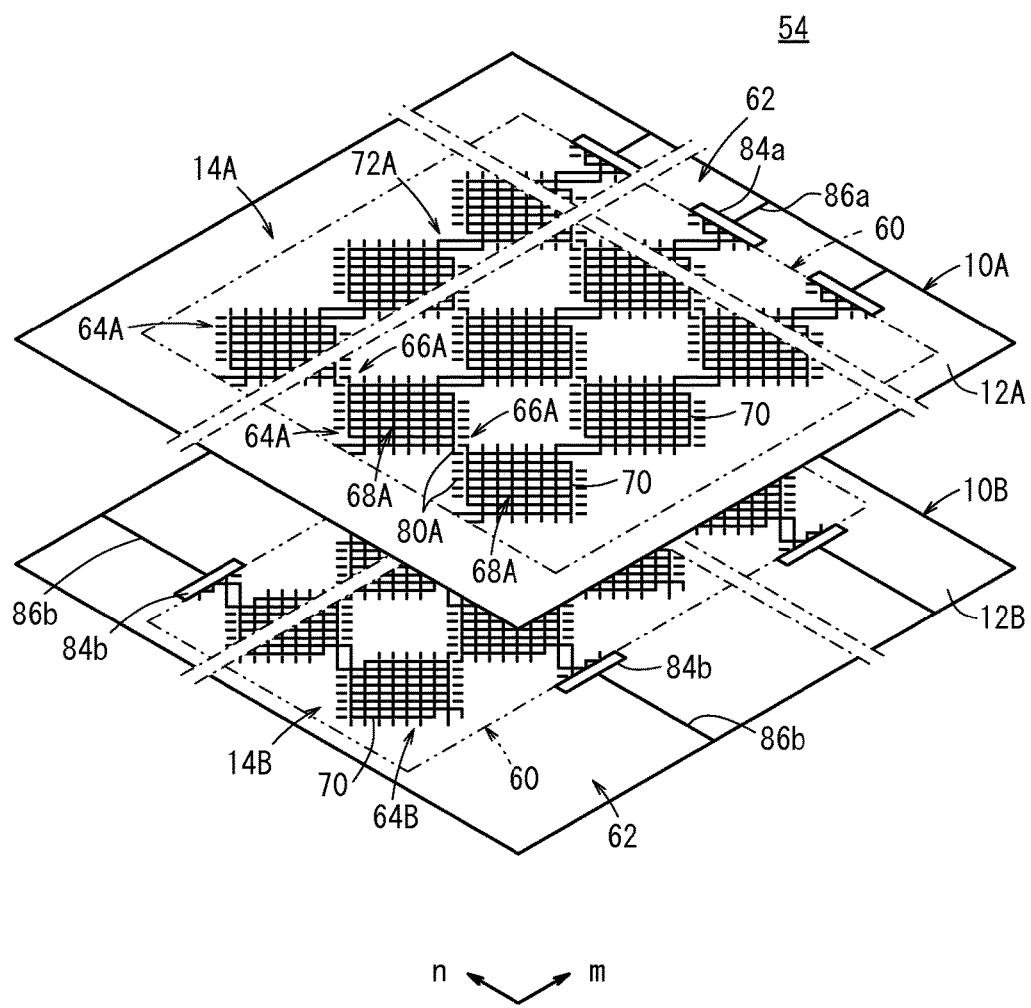
FIG. 7 is a partially omitted exploded perspective view of the first conductive film stack.
Figure 8A:
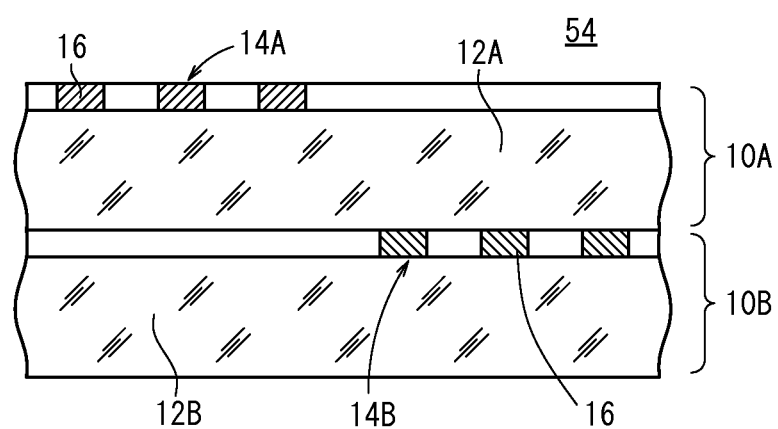
FIG. 8A is a partially omitted cross-sectional view of an example of the first conductive film stack.

A touch panel 50 has a sensor body 52 and a control circuit such as an integrated circuit (not shown). As shown in FIGS. 6, 7, and 8A, the sensor body 52 contains a conductive film stack 54 prepared by laminating a first conductive film 10A and a second conductive film 10B to be hereinafter described, and further contains thereon a protective layer 56 (not shown in FIG. 8A). The conductive film stack 54 and the protective layer 56 can be disposed on a display panel 58 of a display device 30 such as a liquid crystal display. As viewed from above, the sensor body 52 has a sensing region 60 corresponding to a display screen 58a of the display panel 58 and a terminal wiring region 62 (a so-called frame) corresponding to the periphery of the display panel 58.

Figure 9:
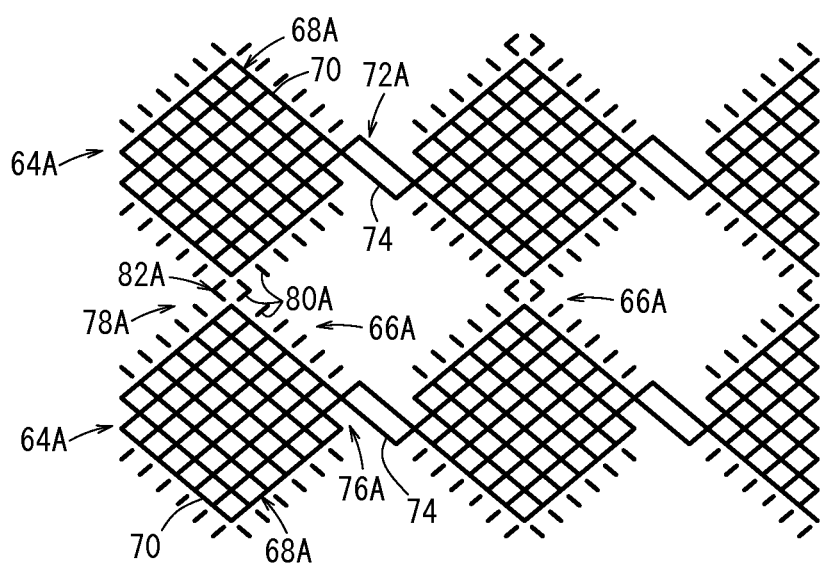
FIG. 9 is a plan view of a pattern example of a first conductive part formed on a first conductive film according to the first embodiment.

As shown in FIGS. 7 and 9, in the touch panel 50, the first conductive film 10A has a first conductive part 14A formed on one main surface of a first transparent substrate 12A (see FIG. 8A). The first conductive part 14A contains two or more first conductive patterns 64A (mesh patterns) and first auxiliary patterns 66A. The first conductive patterns 64A extend in the horizontal direction (the m direction), are arranged in the vertical direction (the n direction) perpendicular to the horizontal or m direction, each contain a large number of lattices, and are composed of the thin metal wires 16. The first auxiliary patterns 66A are arranged around the first conductive patterns 64A and are composed of the thin metal wires 16.

The first conductive pattern 64A has two or more small lattices 70. In the example of FIGS. 7 and 9, the first conductive pattern 64A contains two or more first large lattices 68A (first sensing portions). The first large lattices 68A are connected in series in the horizontal direction, and each contain a combination of two or more small lattices 70. The above first auxiliary pattern 66A is formed around a side of the first large lattice 68A and is not connected to the first large lattice 68A. For example, the m direction corresponds to the horizontal or vertical direction of the projected capacitive touch panel 50 or the display panel 58 equipped therewith to be hereinafter described (see FIG. 6).

The first conductive pattern 64A is not limited to the example using the first large lattices 68A. For example, the first conductive pattern 64A may be such that a large number of the small lattices 70 are arranged to form a strip-shaped mesh pattern, and a plurality of the strip-shaped mesh patterns are arranged in parallel and are isolated from each other by insulations. For example, two or more of strip-shaped first conductive patterns 64A may each extend from a terminal in the m direction and may be arranged in the n direction.

Figure 10:
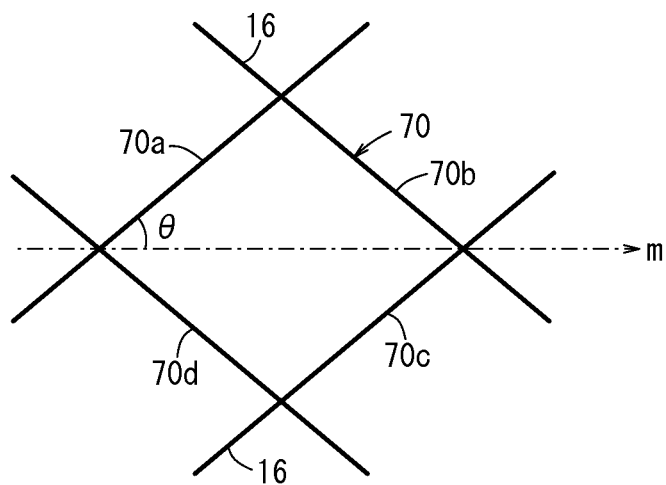
FIG. 10 is a plan view of a small lattice (an opening in a mesh pattern)

In this example, the small lattice 70 is shown as the smallest rhombus in the drawings, and has a shape equal or similar to the above mesh shape 22 (see FIGS. 1 and 4). As shown in FIG. 10, in the small lattice 70, the angle θ between at least one side (of first to fourth sides 70a to 70d) and the first direction (the m direction) is 30° to 60°. In a case where the m direction is equal to the pixel arrangement direction of the display device 30 (see FIG. 5) having the touch panel 50, the angle θ is 30° to 44° or 46° to 60°, more preferably 32° to 39° or 51° to 58°.

The size of the first large lattice 68A will be described below with reference to FIG. 11. Among four sides (first to fourth sides 69a to 69d) of the first large lattice 68A, the first side 69a and the second side 69b are arranged adjacent to each other in the horizontal direction (the m direction), and the intersection of the first side 69a and the second side 69b corresponds to a first corner 71a. Similarly, the third side 69c (facing the first side 69a) and the fourth side 69d (facing the second side 69b) are arranged adjacent to each other in the horizontal direction, and the intersection of the third side 69c and the fourth side 69d corresponds to a second corner 71b.

Furthermore, among the four sides (the first to fourth sides 69a to 69d) of the first large lattice 68A, the first side 69a and the fourth side 69d are arranged adjacent to each other in the vertical direction (the n direction), and the intersection of an extended line of the first side 69a and the fourth side 69d corresponds to a third corner 71c. Similarly, the second side 69b and the third side 69c are arranged adjacent to each other in the vertical direction, and the intersection of the second side 69b and an extended line of the third side 69c corresponds to a fourth corner 71d.

The second direction length of the first large lattice 68A corresponds to a distance Lva between the first corner 71a and the second corner 71b in the vertical direction, and the first direction length of the first large lattice 68A corresponds to a distance Lha between the third corner 71c and the fourth corner 71d in the horizontal direction.

In this case, the size, i.e. the aspect ratio (Lva/Lha), of the first large lattice 68A satisfies the condition of 0.57<Lva/Lha<1.74.

In a case where the horizontal direction (the m direction) is equal to the pixel arrangement direction of the display device 30 (see FIG. 6) having the touch panel 50, the aspect ratio (Lva/Lha) of the first large lattice 68A satisfies the condition of 0.57<Lva/Lha<1.00 or 1.00<Lva/Lha<1.74, and more preferably satisfies the condition of 0.62<Lva/Lha<0.81 or 1.23<Lva/Lha<1.61.

Also the small lattice 70 satisfies a similar condition. As shown in FIG. 12, when one diagonal line 70v extending in the vertical direction has a length Lvs and the other diagonal line 70h extending in the horizontal direction has a length Lhs, the size, i.e. the aspect ratio (Lvs/Lhs), of the small lattice 70 satisfies the condition of 0.57<Lvs/Lhs<1.74.

In a case where the horizontal direction is equal to the pixel arrangement direction of the display device 30 (see FIG. 6) having the touch panel 50, also the aspect ratio (Lvs/Lhs) of the small lattice 70 satisfies the condition of 0.57<Lvs/Lhs<1.00 or 1.00<Lvs/Lhs<1.74, and more preferably satisfies the condition of 0.62<Lvs/Lhs<0.81 or 1.23<Lvs/Lhs<1.61.

As described above, the line width of the small lattice 70 (i.e. the thin metal wire 16) may be 30 μm or less. The side length of the small lattice 70 may be selected within a range of 100 to 400 μm. Incidentally, in the first large lattice 68A, the first oblique direction (the x direction) is parallel to the first side 69a (and the third side 69c), and the second oblique direction (the y direction) is parallel to the second side 69b (and the fourth side 69d).

In the case of using the first large lattices 68A in the first conductive patterns 64A, for example, as shown in FIG. 9, first connections 72A composed of the thin metal wires 16 are formed between the first large lattices 68A, and each adjacent two of the first large lattices 68A are electrically connected by the first connection 72A. The first connection 72A contains a medium lattice 74, and the size of the medium lattice 74 corresponds to the total size of n small lattices 70 (in which n is a real number larger than 1) arranged in the second oblique direction (the y direction). A first absent portion 76A (a portion provided by removing one side from the small lattice 70) is formed between the medium lattice 74 and a side of the first large lattice 68A extending along the first oblique direction. In the example of FIG. 9, the size of the medium lattice 74 corresponds to the total size of three small lattices 70 arranged in the second oblique direction.

An electrically isolated first insulation 78A is disposed between the adjacent first conductive patterns 64A.

The first auxiliary pattern 66A contains a plurality of first auxiliary wires 80A having an axis direction parallel to the second oblique direction (arranged along the side of the first large lattice 68A parallel to the first oblique direction), a plurality of first auxiliary wires 80A having an axis direction parallel to the first oblique direction (arranged along the side of the first large lattice 68A parallel to the second oblique direction), and two first L-shaped patterns 82A arranged facing each other. Each of the first L-shaped patterns 82A is formed by combining two first auxiliary wires 80A into an L shape in the first insulation 78A.

The side length of the first large lattice 68A is preferably 3 to 10 mm, more preferably 4 to 6 mm. When the side length is less than the lower limit, for example, in the case of using the first conductive film 10A in a touch panel, the first large lattices 68A exhibit a lowered electrostatic capacitance in the detection process, and the touch panel is likely to cause a detection trouble. On the other hand, when the side length is more than the upper limit, the position detection accuracy may be deteriorated. For the same reasons, the side length of each small lattice 70 in the first large lattices 68A is preferably 100 to 400 μm as described above, further preferably 150 to 300 μm, most preferably 210 to 250 μm. When the side length of the small lattice 70 is within this range, the first conductive film 10A has high transparency and thereby can be suitably used at the front of a display device with excellent visibility.

As shown in FIG. 7, in the first conductive film 10A having the above structure, in one end of each first conductive pattern 64A, the first connection 72A is not formed on the open end of the first large lattice 68A. In the other end of the first conductive pattern 64A, the end of the first large lattice 68A is electrically connected to a first terminal wiring pattern 86a composed of the thin metal wire 16 by a first wire connection 84a.

Thus, as shown in FIGS. 6 and 7, in the first conductive film 10A used in the touch panel 50, a large number of the above first conductive patterns 64A are arranged in the sensing region 60, and a plurality of the first terminal wiring patterns 86a extend from the first wire connections 84a in the terminal wiring region 62.

In the example of FIG. 6, the first conductive film 10A and the sensing region 60 each have a rectangular shape as viewed from above. In the terminal wiring region 62, a plurality of first terminals 88a are arranged in the longitudinal center in the length direction of the periphery on one long side of the first conductive film 10A. The first wire connections 84a are arranged in a straight line in the n direction along one long side of the sensing region 60 (a long side closest to the one long side of the first conductive film 10A). The first terminal wiring pattern 86a extends from each first wire connection 84a to the center of the one long side of the first conductive film 10A, and is electrically connected to the corresponding first terminal 88a.

On the other hand, as shown in FIGS. 7, 8A, and 13, the second conductive film 10B has a second conductive part 14B formed on one main surface of a second transparent substrate 12B (see FIG. 8A). The second conductive part 14B contains two or more second conductive patterns 64B (mesh patterns) and second auxiliary patterns 66B. The second conductive patterns 64B extend in the vertical direction (the n direction), are arranged in the horizontal direction (the m direction), each contain a large number of lattices, and are composed of the thin metal wires 16. The second auxiliary patterns 66B are arranged around the second conductive patterns 64B and are composed of the thin metal wires 16.

The second conductive pattern 64B has two or more small lattices 70. In the example of FIGS. 7 and 13, the second conductive pattern 64B contains two or more second large lattices 68B (second sensing portions). The second large lattices 68B are connected in series in the vertical direction (the n direction), and each contain a combination of two or more small lattices 70. The above second auxiliary pattern 66B is formed around a side of the second large lattice 68B and is not connected to the second large lattice 68B.

Also the second conductive pattern 64B is not limited to the example using the second large lattices 68B. For example, the second conductive pattern 64B may be such that a large number of the small lattices 70 are arranged to form a strip-shaped mesh pattern, and a plurality of the strip-shaped mesh patterns are arranged in parallel and are isolated from each other by insulations. For example, two or more of strip-shaped second conductive patterns 64B may each extend from a terminal in the n direction and may be arranged in the m direction.

Figure 14:
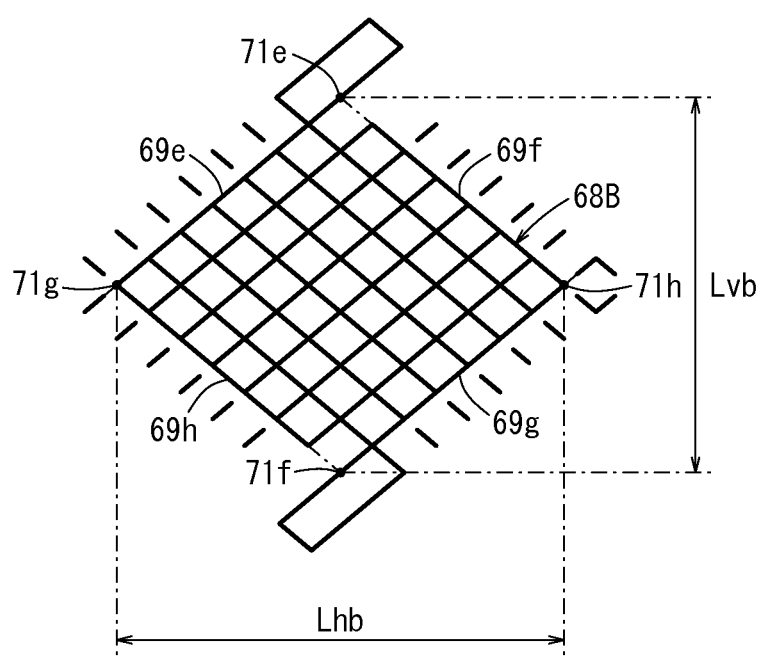
FIG. 14 is a view for illustrating a size (an aspect ratio) of a second large lattice.

The size of the second large lattice 68B will be described below with reference to FIG. 14. Among four sides (fifth to eighth sides 69e to 69h) of the second large lattice 68B, the fifth side 69e and the sixth side 69f are arranged adjacent to each other in the horizontal direction, and the intersection of the fifth side 69e and an extended line of the sixth side 69f corresponds to a fifth corner 71e. Similarly, the seventh side 69g (facing the fifth side 69e) and the eighth side 69h (facing the sixth side 69f) are arranged adjacent to each other in the horizontal direction, and the intersection of the seventh side 69g and an extended line of the eighth side 69h corresponds to a sixth corner 71f.

Furthermore, among the four sides (the fifth to eighth sides 69e to 69h) of the second large lattice 68B, the fifth side 69e and the eighth side 69h are arranged adjacent to each other in the vertical direction, and the intersection of the fifth side 69e and the eighth side 69h corresponds to a seventh corner 71g. Similarly, the sixth side 69f and the seventh side 69g are arranged adjacent to each other in the vertical direction, and the intersection of the sixth side 69f and the seventh side 69g corresponds to an eighth corner 71h.

The second direction length of the second large lattice 68B corresponds to a distance Lvb between the fifth corner 71e and the sixth corner 71f in the vertical direction (the n direction), and the first direction length of the second large lattice 68B corresponds to a distance Lhb between the seventh corner 71g and the eighth corner 71h in the horizontal direction (the m direction).

In this case, the size, i.e. the aspect ratio (Lvb/Lhb), of the second large lattice 68B satisfies the condition of $0.57 < \text{Lvb}/\text{Lhb} < 1.74$.

In a case where the horizontal direction (the m direction) is equal to the pixel arrangement direction of the display device 30 (see FIG. 6) having the touch panel 50, the aspect ratio (Lvb/Lhb) of the second large lattice 68B satisfies the condition of $0.57 < \text{Lvb}/\text{Lhb} < 1.00$ or $1.00 < \text{Lvb}/\text{Lhb} < 1.74$, and more preferably satisfies the condition of $0.62 < \text{Lvb}/\text{Lhb} < 0.81$ or $1.23 < \text{Lvb}/\text{Lhb} < 1.61$.

Incidentally, in the second large lattice 68B, the first oblique direction (the x direction) is parallel to the fifth side 69e (and the seventh side 69g), and the second oblique direction (the y direction) is parallel to the sixth side 69f (and the eighth side 69h).

In the case of using the second large lattices 68B in the second conductive patterns 64B, for example, as shown in FIG. 13, second connections 72B composed of the thin metal wires 16 are formed between the second large lattices 68B, and each adjacent two of the second large lattices 68B are electrically connected by the second connection 72B. The second connection 72B contains a medium lattice 74, and the size of the medium lattice 74 corresponds to the total size of n small lattices 70 (in which n is a real number larger than 1) arranged in the first oblique direction (the x direction). A second absent portion 76B (a portion provided by removing one side from the small lattice 70) is formed between the medium lattice 74 and a side of the second large lattice 68B extending along the second oblique direction.

An electrically isolated second insulation 78B is disposed between the adjacent second conductive patterns 64B.

The second auxiliary pattern 66B contains a plurality of second auxiliary wires 80B having an axis direction parallel to the second oblique direction (arranged along the side of the second large lattice 68B parallel to the first oblique direction), a plurality of second auxiliary wires 80B having an axis direction parallel to the first oblique direction (arranged along the side of the second large lattice 68B parallel to the second oblique direction), and two second L-shaped patterns 82B arranged facing each other. Each of the second L-shaped patterns 82B is formed by combining two second auxiliary wires 80B into an L shape in the second insulation 78B.

As shown in FIGS. 6 and 7, in the second conductive film 10B having the above structure, for example, in each of one end of each alternate (odd-numbered) second conductive pattern 64B and the other end of each even-numbered second conductive pattern 64B, the second connection 72B is not formed on the open end of the second large lattice 68B. In each of the other end of each odd-numbered second conductive pattern 64B and one end of each even-numbered second conductive pattern 64B, the end of the second large lattice 68B is electrically connected to a second terminal wiring pattern 86*b* composed of the thin metal wires 16 by a second wire connection 84*b*.

Thus, as shown in FIG. 7, in the second conductive film 10B used in the touch panel 50, a large number of the above second conductive patterns 64B are arranged in the sensing region 60, and a plurality of the second terminal wiring patterns 86*b* extend from the second wire connections 84*b* in the terminal wiring region 62.

As shown in FIG. 6, in the terminal wiring region 62, a plurality of second terminals 88*b* are arranged in the longitudinal center in the length direction of the periphery on one long side of the second conductive film 10B. For example, the odd-numbered second wire connections 84*b* are arranged in a straight line in the m direction along one short side of the sensing region 60 (a short side closest to one short side of the second conductive film 10B), and the even-numbered second wire connections 84*b* are arranged in a straight line in the m direction along the other short side of the sensing region 60 (a short side closest to the other short side of the second conductive film 10B).

For example, each odd-numbered second conductive pattern 64B is connected to the corresponding odd-numbered second wire connection 84*b*, and each even-numbered second conductive pattern 64B is connected to the corresponding even-numbered second wire connection 84*b*. The second terminal wiring patterns 86*b* are drawn from the odd-numbered and even-numbered second wire connections 84*b* to the center of one long side of the second conductive film 10B, and are each electrically connected to the corresponding second terminals 88*b*.

The first terminal wiring patterns 86*a* may be arranged in the same manner as the above second terminal wiring patterns 86*b*, and the second terminal wiring patterns 86*b* may be arranged in the same manner as the above first terminal wiring patterns 86*a*.

The side length of the second large lattice 68B is preferably 3 to 10 mm, more preferably 4 to 6 mm, as with the first large lattice 68A. When the side length is less than the lower limit, the second large lattices 68B are likely to exhibit a lowered electrostatic capacitance to cause a detection trouble in the detection process. On the other hand, when the side length is more than the upper limit, the position detection accuracy may be deteriorated. For the same reasons, the side length of each small lattice 70 in the second large lattices 68B is preferably 100 to 400 µm, further preferably 150 to 300 µm, most preferably 210 to 250 µm. When the side length of the small lattice 70 is within this range, the second conductive film 10B has high transparency and thereby can be suitably used with excellent visibility on the display panel 58 of the display device 30.

The line width of each of the first auxiliary patterns 66A (the first auxiliary wires 80A) and the second auxiliary patterns 66B (the second auxiliary wires 80B) is 30 µm or less, and may be equal to or different from those of the first conductive patterns 64A and the second conductive patterns 64B. It is preferred that the first conductive patterns 64A, the second conductive patterns 64B, the first auxiliary patterns 66A, and the second auxiliary patterns 66B have the same line width.

Figure 15:
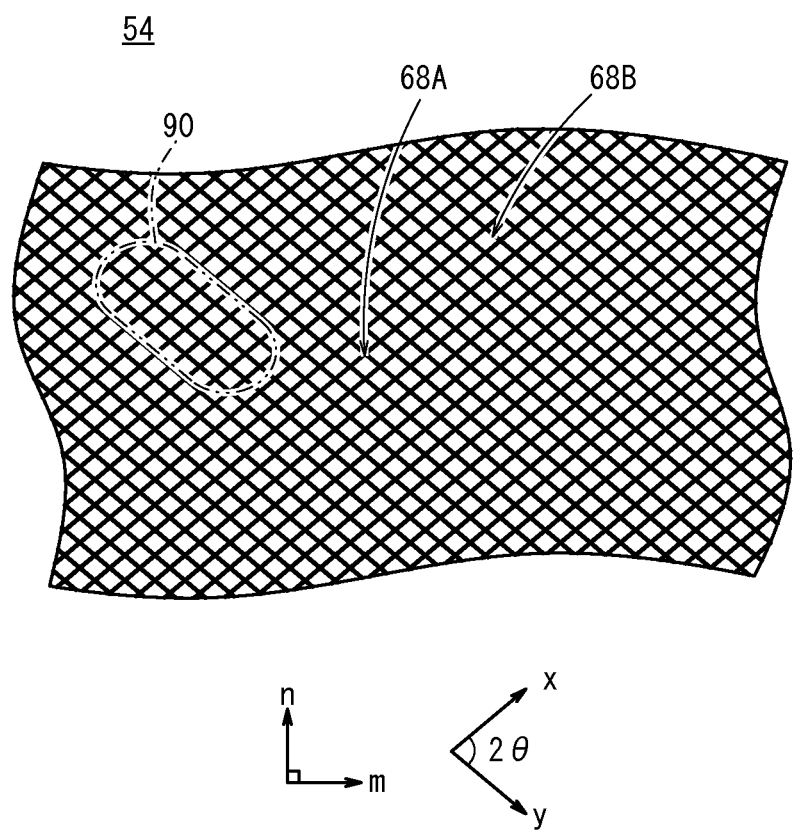
FIG. 15 is a partially omitted plan view of the first conductive film stack formed by combining the first and second conductive films of the first embodiment.

For example, as shown in FIG. 15, when the first conductive film 10A is stacked on the second conductive film 10B to form the conductive film stack 54, the first conductive patterns 64A and the second conductive patterns 64B are crossed. Specifically, the first connections 72A of the first conductive patterns 64A and the second connections 72B of the second conductive patterns 64B are arranged facing each other with the first transparent substrate 12A (see FIG. 8A) interposed therebetween, and also the first insulations 78A of the first conductive part 14A and the second insulations 78B of the second conductive part 14B are arranged facing each other with the first transparent substrate 12A interposed therebetween.

Figure 16:
FIG. 16 is an explanatory view of one line formed by first and second auxiliary wires.

As shown in FIG. 15, when the conductive film stack 54 is observed from above, the spaces between the first large lattices 68A of the first conductive film 10A are filled with the second large lattices 68B of the second conductive film 10B. In this case, the first auxiliary patterns 66A and the second auxiliary patterns 66B overlap with each other to form combined patterns 90 between the first large lattices 68A and the second large lattices 68B. As shown in FIG. 16, in the combined pattern 90, a first axis 92A of the first auxiliary wire 80A corresponds to a second axis 92B of the second auxiliary wire 80B, the first auxiliary wire 80A does not overlap with the second auxiliary wire 80B, and an end of the first auxiliary wire 80A corresponds to an end of the second auxiliary wire 80B, whereby one side of the small lattice 70 (the mesh shape) is formed. Therefore, the combined pattern 90 contains a combination of two or more small lattices 70 (mesh shapes). Consequently, as shown in FIG. 15, when the conductive film stack 54 is observed from above, the entire surface is covered with a large number of the small lattices 70 (the mesh shapes).

When the conductive film stack 54 is disposed on the display panel 58 of the display device 30, for example, as shown in FIG. 5, a plurality of the thin metal wires 16, which extend in the first oblique direction (the x direction) and are arranged at the thin wire pitch Ps in the second oblique direction (the y direction), and a plurality of the thin metal wires 16, which extend in the second oblique direction and are arranged at the thin wire pitch Ps in the first oblique direction, are crossed to form the mesh pattern 20. Each thin metal wire 16 forms a certain oblique angle θ with the horizontal arrangement direction (the m direction) of the pixels 32 in the display device 30. Each thin metal wire 16 in a large number of the small lattices 70 is at an angle of 30° to 60°, preferably 30° to 44°, with respect to the horizontal arrangement direction (the m direction) of the pixels 32 in the display device 30. The thin wire pitch Ps of the conductive film stack 54 is approximately equal or close to the diagonal length La1 of one pixel 32 (or the diagonal length La2 of two adjacent pixels 32 arranged in the vertical direction) in the display device 30, and the arrangement direction of the thin metal wires 16 in the conductive film stack 54 is approximately equal or close to the direction of the diagonal line of one pixel 32 (or the diagonal line of two adjacent pixels 32 arranged in the vertical direction) in the display device 30. Consequently, the arrangement period difference between the pixels 32 and the thin metal wires 16 can be reduced to prevent the moire generation. Furthermore, even in a case where the aspect ratio of the first large lattice 68A is greatly different from the aspect ratio of the second large lattice 68B in the conductive film stack 54, the moire generation can be effectively prevented. Thus, the conductive film stack 54 can be obtained with an improved yield.

When the conductive film stack 54 is used in the touch panel, the protective layer 56 is formed on the first conductive film 10A, and the first terminal wiring patterns 86*a* extending from the first conductive patterns 64A in the first conductive film 10A and the second terminal wiring patterns 86*b* extending from the second conductive patterns 64B in the second conductive film 10B are connected to a scan control circuit or the like.

A self or mutual capacitance technology can be preferably used for detecting a touch position. In the self capacitance technology, a voltage signal for the touch position detection is sequentially supplied to the first conductive patterns 64A, and further a voltage signal for the touch position detection is sequentially supplied to the second conductive patterns 64B. When a finger comes into contact with or close to the upper surface of the protective layer 56, the capacitance between the first conductive pattern 64A and the second conductive pattern 64B in the touch position and the GND (ground) is increased, whereby signals from this first conductive pattern 64A and this second conductive pattern 64B have waveforms different from those of signals from the other conductive patterns. Thus, the touch position is calculated by a control circuit based on the signals transmitted from the first conductive pattern 64A and the second conductive pattern 64B. On the other hand, in the mutual capacitance technology, for example, a voltage signal for the touch position detection is sequentially supplied to the first conductive patterns 64A, and the second conductive patterns 64B are sequentially subjected to sensing (transmitted signal detection). When a finger comes into contact with or close to the upper surface of the protective layer 56, the parallel stray capacitance of the finger is added to the parasitic capacitance between the first conductive pattern 64A and the second conductive pattern 64B in the touch position, whereby a signal from this second conductive pattern 64B has a waveform different from those of signals from the other second conductive patterns 64B. Thus, the touch position is calculated by a control circuit based on the order of the first conductive pattern 64A supplied with the voltage signal and the signal transmitted from the second conductive pattern 64B. Even when two fingers come into contact with or close to the upper surface of the protective layer 56 simultaneously, the touch positions can be detected by using the self or mutual capacitance technology. Conventional related detection circuits used in projected capacitive technologies are described in U.S. Pat. Nos. 4,582,955, 4,686,332, 4,733,222, 5,374,787, 5,543,588, and 7,030,860, US Patent Application Publication No. 2004/0155871, etc.

Figure 17:
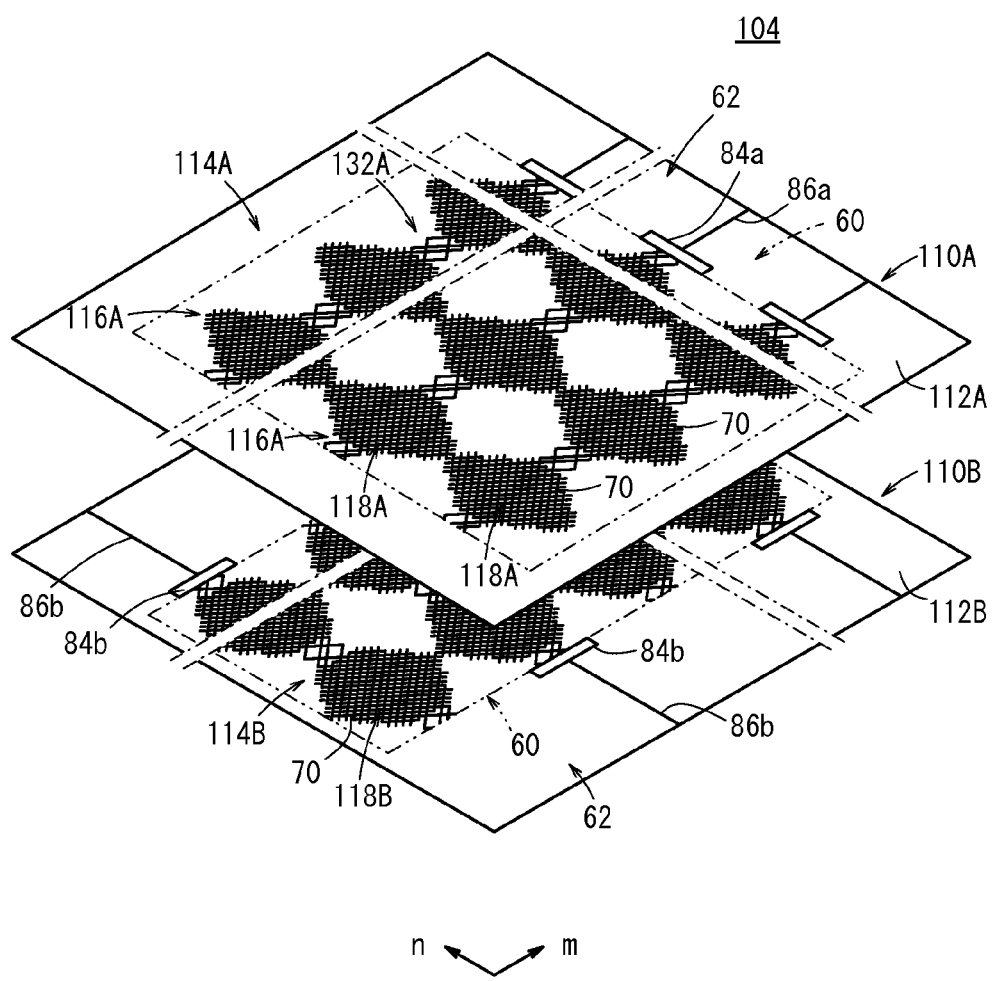
FIG. 17 is a partially omitted exploded perspective view of a conductive film stack according to a second embodiment (a second conductive film stack)

A second embodiment will be described below with reference to FIGS. 17 to 21. As shown in FIG. 17, a conductive film stack 104 according to the second embodiment is prepared by laminating a first conductive film 110A and a second conductive film 110B in the same manner as the conductive film stack 54 according to the first embodiment. The conductive film stack 104 can be used e.g. in the sensor body 52 of the touch panel 50 on the display device 30 shown in FIG. 6. The conductive films 110 (the first conductive film 110A and the second conductive film 110B) can be used as the electromagnetic-shielding film of the display device 30 shown in FIG. 3, the conductive touch panel film, or the like.

Figure 18A:
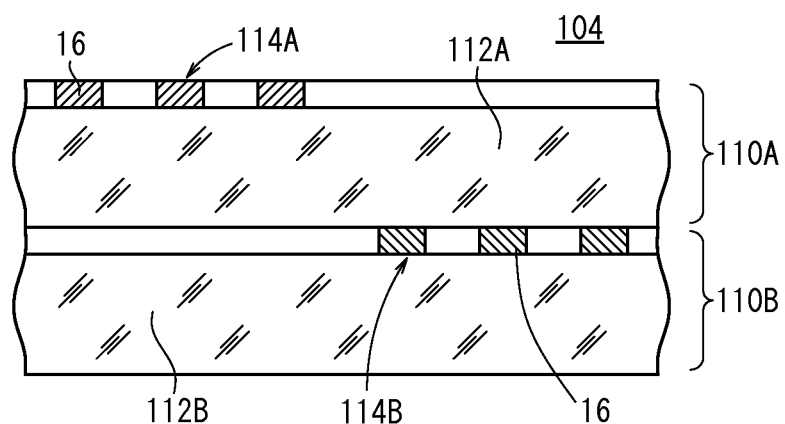
FIG. 18A is a partially omitted cross-sectional view of an example of the second conductive film stack.
Figure 19:
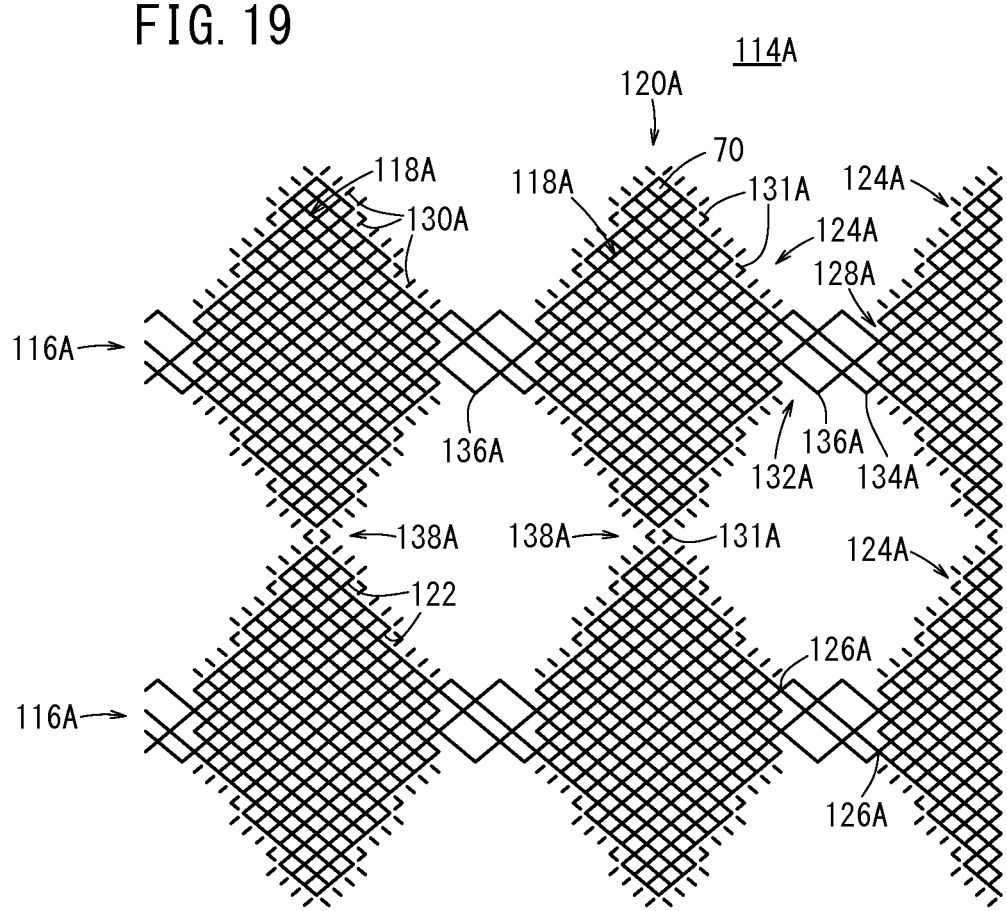
FIG. 19 is a plan view of a pattern example of a first conductive part formed on a first conductive film according to the second embodiment.

As shown in FIGS. 17, 18A, and 19, the first conductive film 110A has a first transparent substrate 112A (see FIG. 18A) and a first conductive part 114A formed on one main surface of the first transparent substrate 112A. The first conductive part 114A contains two or more first conductive patterns 116A (mesh patterns) and first auxiliary patterns 120A. The first conductive patterns 116A extend in the horizontal direction (the m direction), are arranged in the vertical direction (the n direction) perpendicular to the horizontal direction, each contain a large number of lattices, and are composed of the thin metal wires 16. The first auxiliary patterns 120A are arranged around the first conductive patterns 116A and are composed of the thin metal wires 16. For example, the horizontal direction (the m direction) corresponds to the horizontal or vertical direction of the projected capacitive touch panel 50 or the display panel 58 equipped therewith. Also in this example, the small lattice 70 is shown as the smallest rhombus in the drawings, and has a shape equal or similar to the above mesh shape 22 of the first embodiment (see FIGS. 1 and 4).

In the second embodiment, as well as in the first embodiment, as shown in FIG. 12, the aspect ratio (Lvs/Lhs) of the small lattice 70 satisfies the condition of $0.57<Lvs/Lhs<1.74$. In a case where the horizontal direction is equal to the pixel arrangement direction of the display device 30 (see FIG. 6) having the touch panel 50, the aspect ratio (Lvs/Lhs) of the small lattice 70 satisfies the condition of $0.57<Lvs/Lhs<1.00$ or $1.00<Lvs/Lhs<1.74$, and more preferably satisfies the condition of $0.62<Lvs/Lhs<0.81$ or $1.23<Lvs/Lhs<1.61$. As described above, the line width of the small lattice 70 (i.e. the thin metal wire 16) may be 30 μm or less. The side length of the small lattice 70 may be selected within a range of 100 to 400 μm.

The first conductive pattern 116A contains two or more first large lattices 118A (first sensing portions). The first large lattices 118A are connected in series in the horizontal direction (the m direction), and each contain a combination of two or more small lattices 70. The above first auxiliary pattern 120A is formed around a side of the first large lattice 118A and is not connected to the first large lattice 118A.

The first large lattice 118A has a substantially rhombic shape, which has first staircase patterns 124A containing one or more steps 122 on the oblique sides. The height of the step 122 is equal to the integral multiple of the height of the small lattice 70. In the example of FIG. 19, on the oblique side of the first large lattice 118A, two steps 122 are formed on the third and seventh small lattices 70 in the direction from a vertically extending corner toward a horizontally extending corner, and the heights of the steps 122 are equal to the height of one small lattice 70. The first staircase pattern 124A is such that the columns of the small lattices 70 are reduced at the steps 122 in the direction from a vertically extending corner to a horizontally extending corner in the first large lattice 118A.

As described above, the first large lattice 118A has the substantially rhombic shape. More specifically, the first large lattice 118A has an abacus bead shape, which is provided by removing several small lattices 70 in the horizontally extending corners. Thus, r small lattices 70 (in which r is an integer of more than 1) are arranged in the vertical direction to form a first upper base 126A on each of the two horizontally extending corners, and one small lattice 70 is positioned to form the vertex angle on each of the vertically extending corners. In FIG. 19, four small lattices 70 are arranged in the vertical direction to form the first upper base 126A on each of the two horizontally extending corners of the first large lattice 118A.

In this case, when the aspect ratio of the largest rhombus enclosable in the first large lattice 118A (i.e. the largest rhombus formed between the two first upper bases 126A on the horizontally extending corners) is considered as the aspect ratio (Lva/Lha) of the first large lattice 118A for convenience, the aspect ratio (Lva/Lha) satisfies the condition of $0.57<Lva/Lha<1.74$.

In a case where the horizontal direction (the m direction) is equal to the pixel arrangement direction of the display device 30 (see FIG. 6) having the touch panel 50, the aspect ratio (Lva/Lha) of the first large lattice 118A satisfies the condition of $0.57<Lva/Lha<1.00$ or $1.00<Lva/Lha<1.74$, and more preferably satisfies the condition of $0.62<Lva/Lha<0.81$ or $1.23<Lva/Lha<1.61$.

A first absent portion 128A (a portion provided by removing one side from the small lattice 70) is formed between the first upper base 126A on the horizontally extending corner and the oblique side of the first large lattice 118A extending along the first oblique direction (the x direction).

As shown in FIG. 19, first connections 132A composed of the thin metal wires 16 are formed between the first large lattices 118A, and each adjacent two of the first large lattices 118A are electrically connected by the first connection 132A. The first connection 132A contains first medium lattices 134A and 136A. The size of the first medium lattice 134A corresponds to the total size of n small lattices 70 (in which n is an integer larger than 1) arranged in the second oblique direction (the y direction). The size of the first medium lattice 136A corresponds to the total size of p×q small lattices 70 (in which p and q are each an integer larger than 1). Thus, the first medium lattice 136A is such that p small lattices 70 are arranged in the second oblique direction and q small lattices 70 are arranged in the first oblique direction. In the example of FIG. 19, n is 7, whereby the size of the first medium lattice 134A corresponds to the total size of seven small lattices 70 arranged in the second oblique direction. In the example of FIG. 19, p (the number in the second oblique direction) is 3, and q (the number in the first oblique direction) is 5, whereby the size of the first medium lattice 136A corresponds to the total size of fifteen small lattices 70.

The first absent portion 128A (the portion provided by removing one side from the small lattice 70) is formed between the first medium lattice 136A and the first large lattice 118A.

First disconnection portions 138A are disposed between the adjacent first conductive patterns 116A arranged in the vertical direction, and each adjacent two of the first large lattices 118A are isolated from each other by the first disconnection portion 138A.

The above first auxiliary pattern 120A is formed around the side of the first large lattice 118A in the first conductive part 114A, and is not connected to the first large lattice 118A. The first auxiliary pattern 120A contains a plurality of first auxiliary wires 130A (having an axis direction parallel to the second oblique direction) arranged along the first staircase pattern 124A on the oblique side of the first large lattice 118A parallel to the first oblique direction, a plurality of first auxiliary wires 130A (having an axis direction parallel to the first oblique direction) arranged along the first staircase pattern 124A on the oblique side of the first large lattice 118A parallel to the second oblique direction, and a first L-shaped pattern 131A formed by combining two first auxiliary wires 130A into an L shape.

The axis-direction length of each first auxiliary wire 130A is ½ of the inside side length of the small lattice 70. The first auxiliary wire 130A is positioned at a predetermined distance from the first large lattice 118A. The predetermined distance is equal to ½ of the inside side length of the small lattice 70 in this example.

The first L-shaped pattern 131A is formed in the vicinity of the step 122 of the first staircase pattern 124A by combining the first auxiliary wire 130A having the axis direction parallel to the first oblique direction and the first auxiliary wire 130A having the axis direction parallel to the second oblique direction. The first L-shaped pattern 131A faces a corner of the step 122 or positioned in the first disconnection portion 138A between the first large lattices 118A. As shown in FIG. 19, in the first disconnection portion 138A, two first auxiliary wires 130A are disposed in the vicinity of a vertically extending corner of one first large lattice 118A, and two first auxiliary wires 130A are disposed in the vicinity of a vertically extending corner of the adjacent first large lattice 118A, whereby two first L-shaped patterns 131A are arranged facing each other in the horizontal direction.

The side length of each small lattice 70 in the first large lattices 118A is preferably 50 µm or more, more preferably 100 to 400 µm, further preferably 150 to 300 µm, most preferably 210 to 250 µm. When the side length of the small lattice 70 is within this range, the first conductive film 110A has high transparency and thereby can be suitably used at the front of a display device with excellent visibility.

As shown in FIG. 17, in the first conductive film 110A having the above structure, in one end of each first conductive pattern 116A, the first connection 132A is not formed on the open end of the first large lattice 118A. In the other end of the first conductive pattern 116A, the end of the first large lattice 118A is connected to the first terminal wiring pattern 86a composed of the thin metal wire 16 by the first wire connection 84a.

On the other hand, as shown in FIGS. 17, 18A, and 20, the second conductive film 110B has a second conductive part 114B formed on one main surface of a second transparent substrate 112B (see FIG. 18A). The second conductive part 114B contains two or more second conductive patterns 116B (mesh patterns) and second auxiliary patterns 120B. The second conductive patterns 116B extend in the vertical direction (the n direction), are arranged in the horizontal direction (the m direction), each contain a large number of lattices, and are composed of the thin metal wires 16. The second auxiliary patterns 120B are arranged around the second conductive patterns 116B and are composed of the thin metal wires 16.

The second conductive pattern 116B contains two or more second large lattices 118B (second sensing portions). The second large lattices 118B are connected in series in the vertical direction (the n direction), and each contain a combination of two or more small lattices 70. The above second auxiliary pattern 120B is formed around a side of the second large lattice 118B and is not connected to the second large lattice 118B.

The second large lattice 118B has a substantially rhombic shape, which has second staircase patterns 124B containing one or more steps 122 on the oblique sides. The height of the step 122 is equal to the integral multiple of the height of the small lattice 70. In the example of FIG. 20, on the oblique side of the second large lattice 118B, two steps 122 are formed at a distance of four small lattices 70, and the heights of the steps 122 are equal to the height of one small lattice 70. The second staircase pattern 124B is such that the columns of the small lattices 70 are increased at the steps 122 in the direction from a horizontally extending corner to a vertically extending corner in the second large lattice 118B.

As described above, the second large lattice 118B has the substantially rhombic shape. More specifically, the second large lattice 118B has an abacus bead shape, which is provided by removing several small lattices 70 in the vertically extending corners. Thus, r small lattices 70 (in which r is an integer of more than 1) are arranged in the horizontal direction to form a second upper base 126B on each of the two vertically extending corners, and one small lattice 70 is positioned to form the vertex angle on each of the horizontally extending corners. In FIG. 20, four small lattices 70 are arranged in the horizontal direction to form the second upper base 126B on each of the two vertically extending corners of the second large lattice 118B.

In this case, when the aspect ratio of the largest rhombus enclosable in the second large lattice 118B (i.e. the largest rhombus formed between the two horizontally extending corners) is considered as the aspect ratio (Lva/Lha) of the second large lattice 118B for convenience, the aspect ratio (Lva/Lha) satisfies the condition of 0.57<Lva/Lha<1.74.

In a case where the horizontal direction (the m direction) is equal to the pixel arrangement direction of the display device 30 (see FIG. 6) having the touch panel 50, the aspect ratio (Lva/Lha) of the second large lattice 118B satisfies the condition of 0.57<Lva/Lha<1.00 or 1.00<Lva/Lha<1.74, and more preferably satisfies the condition of 0.62<Lva/Lha<0.81 or 1.23<Lva/Lha<1.61.

A second absent portion 128B (a portion provided by removing one side from the small lattice 70) is formed between the second upper base 126B on the vertically extending corner and the oblique side of the second large lattice 118B extending along the second oblique direction.

As shown in FIG. 20, second connections 132B composed of the thin metal wires 16 are formed between the second large lattices 118B, and each adjacent two of the second large lattices 118B arranged in the vertical direction are connected by the second connection 132B. The second connection 132B contains second medium lattices 134B and 136B. The size of the second medium lattice 134B corresponds to the total size of n small lattices 70 (in which n is an integer larger than 1) arranged in the first oblique direction. The size of the second medium lattice 136B corresponds to the total size of p×q small lattices 70 (in which p and q are each an integer larger than 1). Thus, the second medium lattice 136B is formed such that p small lattices 70 are arranged in the first oblique direction and q small lattices 70 are arranged in the second oblique direction. In the example of FIG. 20, n is 7, whereby the size of the second medium lattice 134B corresponds to the total size of seven small lattices 70 arranged in the first oblique direction. In the example of FIG. 20, p (the number in the first oblique direction) is 3, and q (the number in the second oblique direction) is 5, whereby the size of the second medium lattice 136B corresponds to the total size of fifteen small lattices 70.

The second absent portion 128B (the portion provided by removing one side from the small lattice 70) is formed between the second medium lattice 136B and the second large lattice 118B.

Second disconnection portions 138B are disposed between the adjacent second conductive patterns 116B arranged in the horizontal direction, and each adjacent two of the second large lattices 118B are isolated from each other by the second disconnection portion 138B.

The above-mentioned second auxiliary pattern 120B is formed around the side of the second large lattice 118B in the second conductive part 114B, and is not connected to the second large lattice 118B. The second auxiliary pattern 120B contains a plurality of second auxiliary wires 130B (having an axis direction parallel to the first oblique direction) arranged along the second staircase pattern 124B on the oblique side of the second large lattice 118B parallel to the second oblique direction, a plurality of second auxiliary wires 130B (having an axis direction parallel to the second oblique direction) arranged along the second staircase pattern 124B on the oblique side of the second large lattice 118B parallel to the first oblique direction, and a second L-shaped pattern 131B formed by combining two second auxiliary wires 130B into an L shape.

The axis-direction length of each second auxiliary wire 130B is ½ of the inside side length of the small lattice 70, in the same manner as the first auxiliary wire 130A. The second auxiliary wire 130B is positioned at a predetermined distance from the second large lattice 118B. Also the predetermined distance is equal to ½ of the inside side length of the small lattice 70 in the same manner as the first auxiliary wire 130A described above.

The second L-shaped pattern 131B is formed in the vicinity of the step 122 of the second staircase pattern 124B by combining the second auxiliary wire 130B having the axis direction parallel to the first oblique direction and the second auxiliary wire 130B having the axis direction parallel to the second oblique direction. The second L-shaped pattern 131B faces a corner of the step 122 or positioned in the second disconnection portion 138B between the second large lattices 118B. As shown in FIG. 20, in the second disconnection portion 138B, two second auxiliary wires 130B are disposed in the vicinity of a horizontally extending corner of one second large lattice 118B, and two second auxiliary wires 130B are disposed in the vicinity of a horizontally extending corner of the adjacent second large lattice 118B, whereby two second L-shaped patterns 131B are arranged facing each other in the vertical direction.

The side length of each small lattice 70 in the second large lattices 118B is preferably 50 μm or more, more preferably 100 to 400 μm, further preferably 150 to 300 μm, most preferably 210 to 250 μm. When the side length of the small lattice 70 is within this range, the second conductive film 110B has high transparency and thereby can be suitably used at the front of a display device with excellent visibility.

As shown in FIG. 17, in the second conductive film 110B having the above structure, for example, in one end of each alternate odd-numbered second conductive pattern 116B and in the other end of each even-numbered second conductive pattern 116B, the second connection 132B is not formed on the open end of the second large lattice 118B. In the other end of each odd-numbered second conductive pattern 116B and in one end of each even-numbered second conductive pattern 116B, the end of the second large lattice 118B is connected to the second terminal wiring pattern 86b composed of the thin metal wires 16 by the second wire connection 84b. Consequently, the second conductive film 110B is used in the touch panel 50 in the same manner as the first embodiment.

The lower limit of the line width of each of the first conductive patterns 116A (the first large lattices 118A and the first connections 132A) and the second conductive patterns 116B (the second large lattices 118B and the second connections 132B) is preferably 1 μm or more, 3 μm or more, 4 μm or more, or 5 μm or more, and the upper limit is preferably 15 μm or less, 10 μm or less, 9 μm or less, or 8 μm or less. When the line width is less than the lower limit, the conductive film has an insufficient conductivity, whereby a touch panel using the film has an insufficient detection sensitivity. On the other hand, when the line width is more than the upper limit, moire is significantly generated due to the thin metal wire 16, and a touch panel using the film has a poor visibility. When the line width is within the above range, the moire of the conductive patterns composed of the thin metal wires 16 is improved, and the visibility is remarkably improved. It is preferred that at least the first transparent substrate 112A has a thickness of 75 to 350 μm. The thickness is further preferably 80 to 250 μm, particularly preferably 100 to 200 μm.

The lower limit of the line width of each of the first auxiliary patterns 120A (the first auxiliary wires 130A) and the second auxiliary patterns 120B (the second auxiliary wires 130B) is preferably 1 μm or more, 3 μm or more, 4 μm or more, or 5 µm or more, and the upper limit is preferably 15 µm or less, 10 µm or less, 9 µm or less, or 8 µm or less. This line width may be equal to or different from that of the first conductive pattern 116A or the second conductive pattern 116B. Incidentally, it is preferred that the first conductive pattern 116A, the second conductive pattern 116B, the first auxiliary pattern 120A, and the second auxiliary pattern 120B have the same line width.

Figure 21:
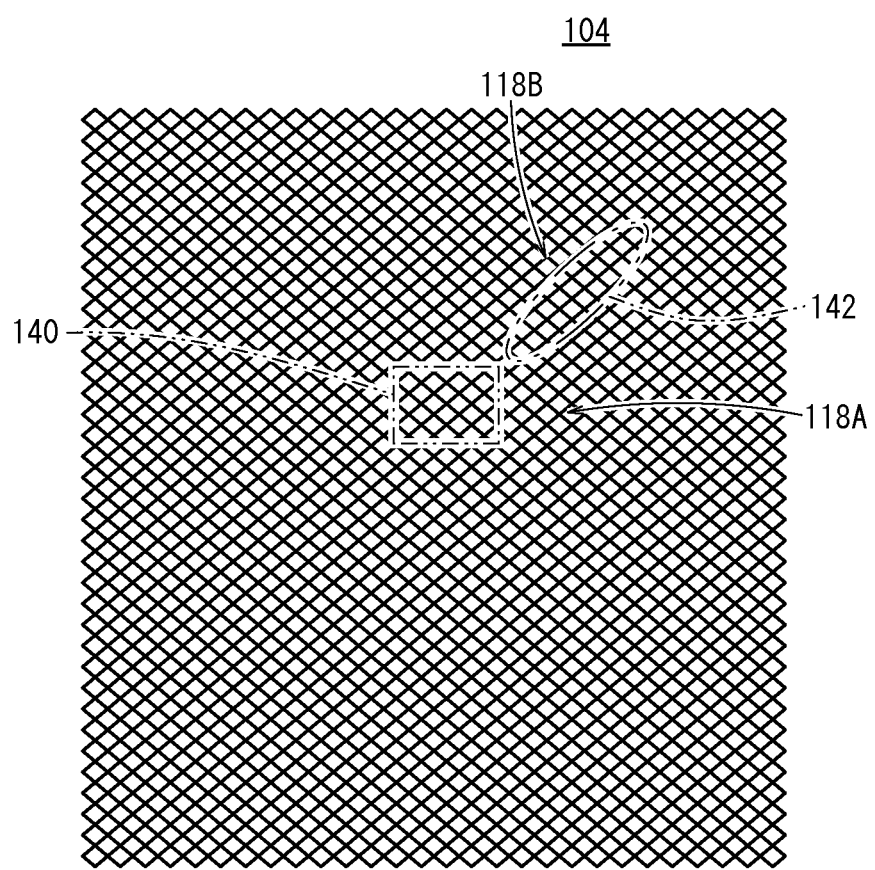
FIG. 21 is a partially omitted plan view of the second conductive film stack formed by combining the first and second conductive films of the second embodiment.

For example, as shown in FIG. 21, when the first conductive film 110A is stacked on the second conductive film 110B to form the conductive film stack 104, the first conductive patterns 116A and the second conductive patterns 116B are crossed. Specifically, the first connections 132A of the first conductive patterns 116A and the second connections 132B of the second conductive patterns 116B are arranged facing each other with the first transparent substrate 112A (see FIG. 18A) interposed therebetween, and also the first disconnection portions 138A of the first conductive part 114A and the second disconnection portions 138B of the second conductive part 114B are arranged facing each other with the first transparent substrate 112A interposed therebetween.

As shown in FIG. 21, when the conductive film stack 104 is observed from above, the spaces between the first large lattices 118A of the first conductive film 110A are filled with the second large lattices 118B of the second conductive film 110B.

In this case, the first connections 132A and the second connections 132B overlap with each other. Thus, the first medium lattices 134A and the second medium lattices 134B overlap with each other, and the first medium lattices 136A and the second medium lattices 136B overlap with each other, to form combined patterns 140 having a substantially rectangular shape. In the combined pattern 140, the first medium lattice 134A and the second medium lattice 134B are located on a diagonal line. In the combined pattern 140 formed by the first connection 132A and the second connection 132B shown in FIGS. 19 and 20, seven small lattices 70 are arranged on a diagonal line, and four small lattices 70 are arranged on each of the four sides. Thus, the combined pattern 140 contains total 25 small lattices 70. On a corner of the combined pattern 140, the removed one side in the second absent portion 128B of the second large lattice 118B is compensated by one side of the small lattice 70 in the first medium lattice 134A, and the removed one side in the first absent portion 128A of the first large lattice 118A is compensated by one side of the small lattice 70 in the second medium lattice 134B.

Furthermore, the first auxiliary patterns 120A and the second auxiliary patterns 120B overlap with each other to form combined patterns 142 between the first large lattices 118A and the second large lattices 118B. In the same manner as the example of the first embodiment shown in FIG. 16, in the combined pattern 142, a first axis of the first auxiliary wire 130A corresponds to a second axis of the second auxiliary wire 130B, the first auxiliary wire 130A does not overlap with the second auxiliary wire 130B, and an end of the first auxiliary wire 130A corresponds to an end of the second auxiliary wire 130B, whereby one side of the small lattice 70 (the mesh shape) is formed.

Therefore, the combined patterns 140 and 142 each contain a combination of two or more small lattices 70 (mesh shapes). Consequently, as shown in FIG. 21, when the conductive film stack 104 is observed from above, the entire surface is covered with a large number of the small lattices 70 (the mesh shapes). A reference position of the second embodiment is such a position that one side of the small lattice 70 is formed by the first auxiliary wire 130A and the second auxiliary wire 130B.

In this embodiment, the first and second staircase patterns 124A and 124B having the steps 122 are arranged in the above manner, whereby the boundaries between the first large lattices 118A and the second large lattices 118B are made further less visible to improve the visibility.

When the conductive film stack 104 is used in the touch panel, the protective layer 56 is formed on the first conductive film 110A, and the first terminal wiring patterns 86a extending from the first conductive patterns 116A in the first conductive film 110A and the second terminal wiring patterns 86b extending from the second conductive patterns 116B in the second conductive film 110B are connected to a scan control circuit or the like.

Figure 8B:
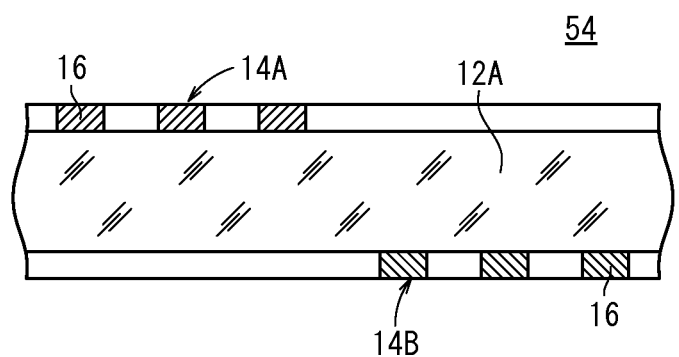
FIG. 8B is a partially omitted cross-sectional view of another example of the first conductive film stack.
Figure 18B:
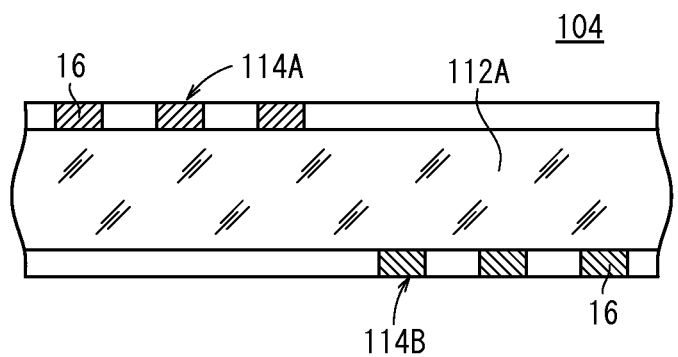
FIG. 18B is a partially omitted cross-sectional view of another example of the second conductive film stack.

The above conductive film stacks 54 and 104 of the first and second embodiments have the structures shown in FIGS. 7, 8A, 17, and 18A. For example, in the first embodiment, the first conductive part 14A is formed on the one main surface of the first transparent substrate 12A, and the second conductive part 14B is formed on the one main surface of the second transparent substrate 12B. Alternatively, as shown in FIGS. 8B and 18B, for example in the first embodiment, the first conductive part 14A may be formed on the one main surface of the first transparent substrate 12A, and the second conductive part 14B may be formed on the other main surface of the first transparent substrate 12A. In this case, the second transparent substrate 12B is not used, the first transparent substrate 12A is stacked on the second conductive part 14B, and the first conductive part 14A is stacked on the first transparent substrate 12A. In addition, another layer may be disposed between the first conductive film 10A and the second conductive film 10B. The first conductive patterns 64A and the second conductive patterns 64B may be arranged facing each other as long as they are insulated.

As shown in FIG. 6, first alignment marks 94a and second alignment marks 94b are preferably formed, for example, on the corners of the first conductive film 10A and the second conductive film 10B. The first alignment marks 94a and the second alignment marks 94b are used for positioning the first conductive film 10A and the second conductive film 10B in the process of bonding the films. When the first conductive film 10A and the second conductive film 10B are bonded to obtain the conductive film stack 54, the first alignment marks 94a and the second alignment marks 94b form composite alignment marks. The composite alignment marks may be used for positioning the conductive film stack 54 in the process of attaching it to the display panel 58.

Though the first conductive films 10A and 110A and the second conductive films 10B and 110B are used in the projected capacitive touch panel 50 in the above embodiments, they can be used in a surface capacitive touch panel or a resistive touch panel.

Though the conductive films 10 and 110 are used as the electromagnetic-shielding film or the conductive touch panel film in the above embodiments, they can be used also as another optical film for the display panel 58 of the display device 30. In this case, the whole surface of the display panel 58 may be covered with the mesh pattern of the conductive film. The whole surface of the display panel 58 may be covered with the mesh pattern 20 of the conductive film 10 or 110, and only a part (such as a corner or a center portion) of the display screen 58a may be covered with the mesh pattern 20 of the conductive film 10 or 110.

A method for producing the conductive film 10 or 110 according to the first embodiment will be described below. It is to be understood that this method can be used also in the second embodiment.

The conductive film 10 may be produced as follows. For example, a photosensitive material having the transparent substrate 12 and thereon a photosensitive silver halide-containing emulsion layer may be exposed and developed, whereby metallic silver portions and light-transmitting portions may be formed in the exposed areas and the unexposed areas respectively to obtain the mesh pattern 20. The metallic silver portions may be subjected to a physical development treatment and/or a plating treatment to deposit a conductive metal thereon.

Alternatively, a photosensitive plating base layer of a pre-plating treatment material may be formed on the first transparent substrate 12A and the second transparent substrate 12B. The resultant may be exposed and developed, and may be subjected to a plating treatment, whereby metal portions and light-transmitting portions may be formed in the exposed areas and the unexposed areas respectively to form the first conductive patterns 64A and the second conductive patterns 64B. The metal portions may be further subjected to a physical development treatment and/or a plating treatment to deposit a conductive metal thereon.

The following two processes can be preferably used in the method using the pre-plating treatment material. The processes are disclosed more specifically in Japanese Laid-Open Patent Publication Nos. 2003-213437, 2006-064923, 2006-058797, and 2006-135271, etc.

(a) A process comprising applying, to a transparent substrate, a plating base layer having a functional group interactable with a plating catalyst or a precursor thereof, exposing and developing the layer, and subjecting the developed layer to a plating treatment to form a metal portion on the plating base material.

(b) A process comprising applying, to a transparent substrate, an underlayer containing a polymer and a metal oxide and a plating base layer having a functional group interactable with a plating catalyst or a precursor thereof in this order, exposing and developing the layers, and subjecting the developed layers to a plating treatment to form a metal portion on the plating base material.

Alternatively, a photoresist film on a copper foil disposed on the transparent substrate 12 may be exposed and developed to form a resist pattern, and the copper foil exposed from the resist pattern may be etched to form the mesh pattern 20.

A paste containing fine metal particles may be printed on the transparent substrate 12, and the printed paste may be plated with a metal to form the mesh pattern 20.

The mesh pattern 20 may be printed on the transparent substrate 12 by using a screen or gravure printing plate.

The mesh pattern 20 may be formed on the transparent substrate 12 by using an inkjet method.

A particularly preferred method, which contains using a photographic photosensitive silver halide material for producing the conductive film 10 according to this embodiment, will be mainly described below.

The method for producing the conductive film 10 of this embodiment includes the following three processes different in the photosensitive materials and development treatments.

(1) A process comprising subjecting a photosensitive black-and-white silver halide material free of physical development nuclei to a chemical or thermal development to form the metallic silver portions on the photosensitive material.

(2) A process comprising subjecting a photosensitive black-and-white silver halide material having a silver halide emulsion layer containing physical development nuclei to a solution physical development to form the metallic silver portions on the photosensitive material.

(3) A process comprising subjecting a stack of a photosensitive black-and-white silver halide material free of physical development nuclei and an image-receiving sheet having a non-photosensitive layer containing physical development nuclei to a diffusion transfer development to form the metallic silver portions on the non-photosensitive image-receiving sheet.

In the process of (1), an integral black-and-white development procedure is used to form a transmittable conductive film such as a light-transmitting conductive film on the photosensitive material. The resulting silver is a chemically or thermally developed silver containing a filament having a high-specific surface area, and thereby shows a high activity in the following plating or physical development treatment.

In the process of (2), the silver halide particles are melted around and deposited on the physical development nuclei in the exposed areas to form a transmittable conductive film such as a light-transmitting conductive film on the photosensitive material. Also in this process, an integral black-and-white development procedure is used. Though high activity can be achieved since the silver halide is deposited on the physical development nuclei in the development, the developed silver has a spherical shape with small specific surface.

In the process of (3), the silver halide particles are melted in the unexposed areas, and are diffused and deposited on the development nuclei of the image-receiving sheet, to form a transmittable conductive film such as a light-transmitting conductive film on the sheet. In this process, a so-called separate-type procedure is used, the image-receiving sheet being peeled off from the photosensitive material.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes, 4th ed.*", Mcmillan, 1977. A liquid treatment is generally used in the present invention, and also a thermal development treatment can be utilized. For example, techniques described in Japanese Laid-Open Patent Publication Nos. 2004-184693, 2004-334077, and 2005-010752 and Japanese Patent Application Nos. 2004-244080 and 2004-085655 can be used in the present invention.

The structure of each layer in the conductive film 10 of this embodiment will be described in detail below.

[Transparent Substrate 12]

The transparent substrate 12 may be a plastic film, a plastic plate, a glass plate, etc.

Examples of materials for the plastic film and the plastic plate include polyesters such as polyethylene terephthalates (PET) and polyethylene naphthalates (PEN), and triacetyl celluloses (TAC).

The transparent substrate 12 is preferably a film or plate of a plastic having a melting point of about 290° C. or lower. The PET is particularly preferred from the viewpoints of light transmittance, workability, etc.

[Silver Salt Emulsion Layer]

The silver salt emulsion layer to be converted to the thin metal wire 16 of the conductive film 10 contains a silver salt and a binder, and may further contain a solvent and an additive such as a dye.

The silver salt used in this embodiment may be an inorganic silver salt such as a silver halide or an organic silver salt such as silver acetate. In this embodiment, the silver halide is preferred because of its excellent light sensing property.

The applied silver amount (the amount of the applied silver salt in the silver density) of the silver salt emulsion layer is preferably 1 to 30 g/m$^2$, more preferably 1 to 25 g/m$^2$, further preferably 5 to 20 g/m$^2$. When the applied silver amount is within this range, the resultant conductive film 10 can exhibit a desired surface resistance.

Examples of the binders used in this embodiment include gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses. The binders show a neutral, anionic, or cationic property depending on the ionicity of a functional group.

In this embodiment, the amount of the binder in the silver salt emulsion layer is not particularly limited, and may be appropriately selected to obtain sufficient dispersion and adhesion properties. The volume ratio of silver/binder in the silver salt emulsion layer is preferably 1/4 or more, more preferably 1/2 or more. The silver/binder volume ratio is preferably 100/1 or less, more preferably 50/1 or less. Particularly, the silver/binder volume ratio is further preferably 1/1 to 4/1, most preferably 1/1 to 3/1. When the silver/binder volume ratio of the silver salt emulsion layer is within the range, the resistance variation can be reduced even under various applied silver amount, whereby the conductive film 10 can be produced with a uniform surface resistance. The silver/binder volume ratio can be obtained by converting the silver halide/binder weight ratio of the material to the silver/binder weight ratio, and by further converting the silver/binder weight ratio to the silver/binder volume ratio.

<Solvent>

The solvent used for forming the silver salt emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

<Other Additives>

The additives used in this embodiment are not particularly limited, and may be preferably selected from known additives.

[Other Layers]

A protective layer (not shown) may be formed on the silver salt emulsion layer. In addition, an undercoat layer or the like may be formed below the silver salt emulsion layer.

The steps for producing the conductive film 10 will be described below.

[Exposure]

In this embodiment, the conductive part 14 may be formed in a printing process, and may be formed by exposure and development treatments, etc. in another process. Thus, a photosensitive material having the transparent substrate 12 and thereon the silver salt-containing layer or a photosensitive material coated with a photopolymer for photolithography is subjected to the exposure treatment. An electromagnetic wave may be used in the exposure. For example, the electromagnetic wave may be a light such as a visible light or an ultraviolet light, or a radiation such as an X-ray. The exposure may be carried out using a light source having a wavelength distribution or a specific wavelength.

[Development Treatment]

In this embodiment, the emulsion layer is subjected to the development treatment after the exposure. Common development treatment technologies for photographic silver salt films, photographic papers, print engraving films, emulsion masks for photomasking, and the like may be used in the present invention.

In the present invention, the development process may include a fixation treatment for removing the silver salt in the unexposed areas to stabilize the material. Fixation treatment technologies for photographic silver salt films, photographic papers, print engraving films, emulsion masks for photomasking, and the like may be used in the present invention.

The developed and fixed photosensitive material is preferably subjected to a water washing treatment or a stabilization treatment.

The ratio of the metallic silver contained in the exposed areas after the development to the silver contained in the areas before the exposure is preferably 50% or more, more preferably 80% or more, by mass. When the ratio is 50% or more by mass, a high conductivity can be achieved.

The conductive film 10 is obtained by the above steps. The surface resistance of the resultant conductive film 10 is preferably within the range of 0.1 to 300 ohm/sq. Preferred surface resistance ranges of the conductive film 10 depend on the use of the conductive film 10. In the case of using the conductive film 10 in the electromagnetic-shielding film, the surface resistance is preferably 10 ohm/sq or less, more preferably 0.1 to 3 ohm/sq. In the case of using the conductive film 10 in the touch panel, the surface resistance is preferably 1 to 70 ohm/sq, more preferably 5 to 50 ohm/sq, further preferably 5 to 30 ohm/sq. The conductive film 10 may be subjected to a calender treatment after the development treatment to obtain a desired surface resistance.

[Physical Development Treatment and Plating Treatment]

In this embodiment, to increase the conductivity of the metallic silver portion formed by the above exposure and development treatments, conductive metal particles may be deposited on the metallic silver portion by a physical development treatment and/or a plating treatment. In the present invention, the conductive metal particles may be deposited on the metallic silver portion by only one of the physical development and plating treatments or by the combination of the treatments. The metallic silver portion, subjected to the physical development treatment and/or the plating treatment in this manner, is also referred to as the conductive metal portion.

In this embodiment, the physical development is such a process that metal ions such as silver ions are reduced by a reducing agent, whereby metal particles are deposited on a metal or metal compound core. Such physical development has been used in the fields of instant B & W film, instant slide film, printing plate production, etc., and the technologies can be used in the present invention. The physical development may be carried out at the same time as the above development treatment after the exposure, and may be carried out after the development treatment separately.

In this embodiment, the plating treatment may contain electroless plating (such as chemical reduction plating or displacement plating), electrolytic plating, or a combination thereof. Known electroless plating technologies for printed circuit boards, etc. may be used in this embodiment. The electroless plating is preferably electroless copper plating.

[Oxidation Treatment]

In this embodiment, the metallic silver portion formed by the development treatment or the conductive metal portion formed by the physical development treatment and/or the plating treatment is preferably subjected to an oxidation treatment. For example, by the oxidation treatment, a small amount of a metal deposited on the light-transmitting portion can be removed, so that the transmittance of the light-transmitting portion can be increased to approximately 100%.

[Conductive Metal Portion]

In this embodiment, the line width of the conductive metal portion (the thin metal wire 16) may be 30 μm or less. The lower limit of the line width is preferably 0.1 μm or more, 1 μm or more, 3 μm or more, 4 μm or more, or 5 μm or more, and the upper limit thereof is preferably 30 μm or less, 15 μm or less, 10 μm or less, 9 μm or less, or 8 μm or less. When the line width is less than the lower limit, the conductive metal portion has an insufficient conductivity, whereby the touch panel 50 using the conductive metal portion has an insufficient detection sensitivity. On the other hand, when the line width is more than the upper limit, moire is significantly generated due to the conductive metal portion, and the touch panel 50 using the conductive metal portion has a poor visibility. When the line width is within the above range, the moire of the conductive metal portion is improved, and the visibility is remarkably improved. The side length of the small lattice 70 is preferably 100 to 400 μm, further preferably 150 to 300 μm, most preferably 210 to 250 μm. The conductive metal portion may have a part with a line width of more than 200 μm for the purpose of ground connection, etc.

In this embodiment, the opening ratio of the conductive metal portion is preferably 85% or more, more preferably 90% or more, most preferably 95% or more, in view of the visible light transmittance. The opening ratio is the ratio of the light-transmitting portions other than the thin metal wires 16 to the entire conductive part. For example, a rhombic shape having a line width of 6 μm and a side length of 240 μm has an opening ratio of 95%.

[Light-Transmitting Portion]

In this embodiment, the light-transmitting portion is a portion having light transmittance, other than the conductive metal portions in the conductive film 10. The transmittance of the light-transmitting portion, which is herein a minimum transmittance value in a wavelength region of 380 to 780 nm obtained neglecting the light absorption and reflection of the transparent substrate 12, is 90% or more, preferably 95% or more, more preferably 97% or more, further preferably 98% or more, most preferably 99% or more.

The exposure is preferably carried out using a glass mask method or a laser lithography pattern exposure method.

[Conductive Film 10]

In the conductive film 10 of this embodiment, the thickness of the transparent substrate 12 is preferably 5 to 350 μm, more preferably 30 to 150 μm. When the thickness is 5 to 350 μm, a desired visible light transmittance can be obtained, and the transparent substrate 12 can be easily handled.

The thickness of the metallic silver portion formed on the transparent substrate 12 may be appropriately selected by controlling the thickness of the coating liquid for the silver salt-containing layer applied to the transparent substrate 12. The thickness of the metallic silver portion may be selected within a range of 0.001 to 0.2 mm, and is preferably 30 μm or less, more preferably 20 μm or less, further preferably 0.01 to 9 μm, most preferably 0.05 to 5 μm. The metallic silver portion is preferably formed in a patterned shape. The metallic silver portion may have a monolayer structure or a multilayer structure containing two or more layers. When the metallic silver portion has a patterned multilayer structure containing two or more layers, the layers may have different wavelength color sensitivities. In this case, different patterns can be formed in the layers by using exposure lights with different wavelengths.

In the case of using the conductive metal portion in the touch panel 50, the conductive metal portion preferably has a smaller thickness. As the thickness is reduced, the viewing angle and visibility of the display panel 58 are improved. Thus, the thickness of the layer of the conductive metal on the conductive metal portion is preferably less than 9 μm, more preferably 0.1 μm or more but less than 5 μm, further preferably 0.1 μm or more but less than 3 μm.

In this embodiment, the thickness of the metallic silver portion can be controlled by changing the coating thickness of the silver salt-containing layer, and the thickness of the conductive metal particle layer can be controlled in the physical development treatment and/or the plating treatment. Therefore, even the conductive film having a thickness of less than 5 μm (preferably less than 3 μm) can be easily produced.

The plating or the like is not necessarily carried out in the method for producing the conductive film 10 of this embodiment. This is because the desired surface resistance can be obtained by controlling the applied silver amount and the silver/binder volume ratio of the silver salt emulsion layer in the method. The calender treatment or the like may be carried out if necessary.

(Film Hardening Treatment after Development Treatment)

It is preferred that after the silver salt emulsion layer is developed, the resultant is immersed in a hardener and thus subjected to a film hardening treatment. Examples of the hardeners include boric acid and dialdehydes such as glutaraldehyde, adipaldehyde, and 2,3-dihydroxy-1,4-dioxane, described in Japanese Laid-Open Patent Publication No. 02-141279.

An additional functional layer such as an antireflection layer or a hard coat layer may be formed on the conductive film 10 of this embodiment.

[Calender Treatment]

The developed metallic silver portion may be smoothened by a calender treatment. The conductivity of the metallic silver portion can be significantly increased by the calender treatment. The calender treatment may be carried out using a calender roll unit. The calender roll unit generally has a pair of rolls.

The roll used in the calender treatment may be composed of a metal or a plastic (such as an epoxy, polyimide, polyamide, or polyimide-amide). Particularly in a case where the photosensitive material has the emulsion layer on both sides, it is preferably treated with a pair of the metal rolls. In a case where the photosensitive material has the emulsion layer only on one side, it may be treated with the combination of the metal roll and the plastic roll in view of wrinkling prevention. The upper limit of the line pressure is preferably 1960 N/cm (200 kgf/cm, corresponding to a surface pressure of 699.4 kgf/cm$^2$) or more, more preferably 2940 N/cm (300 kgf/cm, corresponding to a surface pressure of 935.8 kgf/cm$^2$) or more. The upper limit of the line pressure is 6880 N/cm (700 kgf/cm) or less.

The smoothing treatment such as the calender treatment is preferably carried out at a temperature of 10° C. (without temperature control) to 100° C. Though the preferred treatment temperature range depends on the density and shape of the metal mesh or metal wiring pattern, the type of the binder, etc., the temperature is more preferably 10° C. (without temperature control) to 50° C. in general.

The present invention may be appropriately combined with technologies described in the following patent publications and international patent pamphlets shown in Tables 1 and 2. "Japanese Laid-Open Patent", "Publication No.", "Pamphlet No.", etc. are omitted therein.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific examples are therefore to be considered in all respects as illustrative and not restrictive.

First Example

In First Example, conductive films of Comparative Examples 1 to 6 and Examples 1 to 36 were produced respectively. The opening ratio of each conductive sheet was calculated, and the moire of each conductive sheet was evaluated. The components, calculation results, and evaluation results of Comparative Examples 1 to 6 and Examples 1 to 36 are shown in Tables 3 and 4.

Examples 1 to 36 and Comparative Examples 1 to 6

(Photosensitive Silver Halide Material)

An emulsion containing an aqueous medium, a gelatin, and silver iodobromochloride particles was prepared. The amount of the gelatin was 10.0 g per 150 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-silver to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardening agent were applied to a transparent substrate composed of a polyethylene terephthalate (PET). The amount of the applied silver was 10 g/m², and the Ag/gelatin volume ratio was 2/1.

The PET support had a width of 30 cm, and the emulsion was applied thereto into a width of 25 cm and a length of 20 m. The both end portions having a width of 3 cm were cut off to obtain a roll photosensitive silver halide material having a width of 24 cm.

(Exposure)

An A4 (210 mm×297 mm) sized area of the transparent substrate was exposed in the mesh pattern 20 shown in FIG. 1. The exposure was carried out using a patterned photomask and a parallel light from a light source of a high-pressure mercury lamp.

(Development Treatment)

| Formulation of 1 L of developer | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |

| Formulation of 1 L of fixer | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive material was treated with the above treatment agents using an automatic processor FG-710PTS manufactured by FUJIFILM Corporation under the following conditions. A development treatment was carried out at 35° C. for 30 seconds, a fixation treatment was carried out at 34° C. for 23 seconds, and then a water washing treatment was carried out for 20 seconds at a water flow rate of 5 L/min.

Example 1

In the conductive film produced in Example 1, the thin metal wires 16 had an inclination (an angle θ between the first thin metal wire 16a and the imaginary line 24 extending in the opening 18 in the horizontal direction to connect a plurality of intersection points in the mesh pattern 20) of 30°, a thin wire pitch Ps of 200 μm, and a line width of 6 μm.

Examples 2 to 6

The conductive films of Examples 2, 3, 4, 5, and 6 were produced in the same manner as Example 1 except that the thin metal wires 16 had thin wire pitches Ps of 220, 240, 260, 300, and 400 μm respectively.

Example 7

In the conductive film produced in Example 7, the thin metal wires 16 had an inclination of 36°, a thin wire pitch Ps of 200 µm, and a line width of 6 µm.

Examples 8 to 12

The conductive films of Examples 8, 9, 10, 11, and 12 were produced in the same manner as Example 7 except that the thin metal wires 16 had thin wire pitches Ps of 220, 240, 260, 300, and 400 µm respectively.

Example 13

In the conductive film produced in Example 13, the thin metal wires 16 had an inclination of 37°, a thin wire pitch Ps of 200 µm, and a line width of 6 µm.

Examples 14 to 18

The conductive films of Examples 14, 15, 16, 17, and 18 were produced in the same manner as Example 13 except that the thin metal wires 16 had thin wire pitches Ps of 220, 240, 260, 300, and 400 µm respectively.

Example 19

In the conductive film produced in Example 19, the thin metal wires 16 had an inclination of 39°, a thin wire pitch Ps of 200 µm, and a line width of 6 µm.

Examples 20 to 24

The conductive films of Examples 20, 21, 22, 23, and 24 were produced in the same manner as Example 19 except that the thin metal wires 16 had thin wire pitches Ps of 220, 240, 260, 300, and 400 µm respectively.

Example 25

In the conductive film produced in Example 25, the thin metal wires 16 had an inclination of 40°, a thin wire pitch Ps of 200 µm, and a line width of 6 µm.

Examples 26 to 30

The conductive films of Examples 26, 27, 28, 29, and 30 were produced in the same manner as Example 25 except that the thin metal wires 16 had thin wire pitches Ps of 220, 240, 260, 300, and 400 µm respectively.

Example 31

In the conductive film produced in Example 31, the thin metal wires 16 had an inclination of 44°, a thin wire pitch Ps of 200 µm, and a line width of 6 µm.

Examples 32 to 36

The conductive films of Examples 32, 33, 34, 35, and 36 were produced in the same manner as Example 31 except that the thin metal wires 16 had thin wire pitches Ps of 220, 240, 260, 300, and 400 µm respectively.

Comparative Example 1

In the conductive film produced in Comparative Example 1, the thin metal wires 16 had an inclination of 29°, a thin wire pitch Ps of 200 µm, and a line width of 6 µm.

Comparative Examples 2 and 3

The conductive films of Comparative Examples 2 and 3 were produced in the same manner as Comparative Example 1 except that the thin metal wires 16 had thin wire pitches Ps of 300 and 400 µm respectively.

Comparative Example 4

In the conductive film produced in Comparative Example 4, the thin metal wires 16 had an inclination of 45°, a thin wire pitch Ps of 200 µm, and a line width of 6 µm.

Comparative Examples 5 and 6

The conductive films of Comparative Examples 5 and 6 were produced in the same manner as Comparative Example 4 except that the thin metal wires 16 had thin wire pitches Ps of 300 and 400 µm respectively.

[Evaluation]

(Calculation of Opening Ratio)

The transmittances of the conductive films of Comparative Examples 1 to 6 and Examples 1 to 36 were measured by a spectrophotometer, and the opening ratios were proportionally calculated to evaluate the transparencies.

(Moire Evaluation)

Each of the conductive films of Comparative Examples 1 to 6 and Examples 1 to 36 was attached to the display panel 58 of the display device 30, the display device 30 was fixed to a turntable, and the display device 30 was operated to display a white color. The moire of the conductive film was visually observed and evaluated while turning the turntable within a bias angle range of −20° to +20°. The display device 30 had a horizontal pixel pitch Ph and a vertical pixel pitch Pv of about 192 µm. Pavilion Notebook PC dm1a (11.6-inch glossy liquid crystal display, WXGA/1366×768) manufactured by Hewlett-Packard Company was used in this evaluation.

The moire was observed at a distance of 0.5 m from the display screen of the display device 30. The conductive film was evaluated as "Excellent" when the moire was not visible, as "Fair" when the moire was slightly visible to an acceptable extent, or as "Poor" when the moire was highly visible. In the overall evaluation, each conductive film was evaluated as "A", "B", "C", or "D". A means that the film was evaluated as Excellent in an angular range of 10° or more, B means that the film was evaluated as Excellent in an angular range of less than 10°, C means that the film was not evaluated as Excellent at any angle and was evaluated as Poor in an angular range of less than 30°, and D means that the film was not evaluated as Excellent at any angle and was evaluated as Poor in an angular range of 30° or more.

TABLE 3

| | Thin metal wire | | | Display device | | | |
|---|---|---|---|---|---|---|---|
| | Inclination | Thin wire pitch Ps (μm) | Line width (μm) | Horizontal pixel pitch Ph (μm) | Vertical pixel pitch Pv (μm) | Opening Ratio (%) | Moire evaluation |
| Comparative Example 1 | 29° | 200 | 6 | 192 | 192 | 94 | D |
| Comparative Example 2 | 29° | 300 | 6 | 192 | 192 | 96 | D |
| Comparative Example 3 | 29° | 400 | 6 | 192 | 192 | 97 | D |
| Example 1 | 30° | 200 | 6 | 192 | 192 | 94 | C |
| Example 2 | 30° | 220 | 6 | 192 | 192 | 95 | B |
| Example 3 | 30° | 240 | 6 | 192 | 192 | 95 | B |
| Example 4 | 30° | 260 | 6 | 192 | 192 | 96 | C |
| Example 5 | 30° | 300 | 6 | 192 | 192 | 96 | C |
| Example 6 | 30° | 400 | 6 | 192 | 192 | 97 | C |
| Example 7 | 36° | 200 | 6 | 192 | 192 | 94 | C |
| Example 8 | 36° | 220 | 6 | 192 | 192 | 95 | A |
| Example 9 | 36° | 240 | 6 | 192 | 192 | 95 | A |
| Example 10 | 36° | 260 | 6 | 192 | 192 | 96 | B |
| Example 11 | 36° | 300 | 6 | 192 | 192 | 96 | B |
| Example 12 | 36° | 400 | 6 | 192 | 192 | 97 | B |
| Example 13 | 37° | 200 | 6 | 192 | 192 | 94 | B |
| Example 14 | 37° | 220 | 6 | 192 | 192 | 95 | A |
| Example 15 | 37° | 240 | 6 | 192 | 192 | 95 | A |
| Example 16 | 37° | 260 | 6 | 192 | 192 | 96 | B |
| Example 17 | 37° | 300 | 6 | 192 | 192 | 96 | B |
| Example 18 | 37° | 400 | 6 | 192 | 192 | 97 | B |

TABLE 4

| | Thin metal wire | | | Display device | | | |
|---|---|---|---|---|---|---|---|
| | Inclination | Thin wire pitch Ps (μm) | Line width (μm) | Horizontal pixel pitch Ph (μm) | Vertical pixel pitch Pv (μm) | Opening Ratio (%) | Moire evaluation |
| Example 19 | 39° | 200 | 6 | 192 | 192 | 94 | B |
| Example 20 | 39° | 220 | 6 | 192 | 192 | 95 | A |
| Example 21 | 39° | 240 | 6 | 192 | 192 | 95 | A |
| Example 22 | 39° | 260 | 6 | 192 | 192 | 96 | B |
| Example 23 | 39° | 300 | 6 | 192 | 192 | 96 | B |
| Example 24 | 39° | 400 | 6 | 192 | 192 | 97 | B |
| Example 25 | 40° | 200 | 6 | 192 | 192 | 94 | C |
| Example 26 | 40° | 220 | 6 | 192 | 192 | 95 | B |
| Example 27 | 40° | 240 | 6 | 192 | 192 | 95 | B |
| Example 28 | 40° | 260 | 6 | 192 | 192 | 96 | C |
| Example 29 | 40° | 300 | 6 | 192 | 192 | 96 | C |
| Example 30 | 40° | 400 | 6 | 192 | 192 | 97 | C |
| Example 31 | 44° | 200 | 6 | 192 | 192 | 94 | C |
| Example 32 | 44° | 220 | 6 | 192 | 192 | 95 | B |
| Example 33 | 44° | 240 | 6 | 192 | 192 | 95 | B |
| Example 34 | 44° | 260 | 6 | 192 | 192 | 96 | C |
| Example 35 | 44° | 300 | 6 | 192 | 192 | 96 | C |
| Example 36 | 44° | 400 | 6 | 192 | 192 | 97 | C |
| Comparative Example 4 | 45° | 200 | 6 | 192 | 192 | 94 | D |
| Comparative Example 5 | 45° | 300 | 6 | 192 | 192 | 95 | D |
| Comparative Example 6 | 45° | 400 | 6 | 192 | 192 | 95 | D |

As shown in Tables 3 and 4, the conductive films of Comparative Examples 1 to 6 were evaluated as D, and had highly visible moire. Of Examples 1 to 36, in Examples 1, 4 to 7, 25, 28 to 31, and 34 to 36, the moire was only slightly visible to an acceptable extent. In the other Examples, Examples 2, 3, 10 to 13, 16 to 19, 22 to 24, 26, 27, 32, and 33 were desirable because the moire was hardly generated. In particular, in Examples 8, 9, 14, 15, 20, and 21, the moire generation was not observed because the thin metal wires 16 had an inclination of 36° to 39° and a thin wire pitch Ps of 220 to 240 μm.

Projected capacitive touch panels 50 were produced using the conductive films of Examples 1 to 36 respectively. When the touch panels 50 were operated by a finger touch, they exhibited high response speeds and excellent detection sensitivities. Furthermore, when two or more points were touched, the touch panels 50 exhibited the same excellent properties. Thus, it was confirmed that the touch panels 50 were capable of multi-touch detection.

Second Example

In Second Example, conductive film stacks 54 of Comparative Examples 11 to 16 and Examples 41 to 100 were produced respectively. The opening ratio of each conductive film stack 54 was calculated, and the moire of each conductive film stack 54 was evaluated. The components, calculation results, and evaluation results of Comparative Examples 11 to 16 and Examples 41 to 100 are shown in Tables 5 and 6.

Examples 41 to 100 and Comparative Examples 11 to 16

(Photosensitive Silver Halide Material)

A roll photosensitive silver halide material was prepared in the same manner as First Example.

(Exposure)

An A4 (210 mm×297 mm) sized area of the first transparent substrate 12A was exposed in the pattern of the first conductive film 10A shown in FIGS. 7 and 9, and an A4 sized area of the second transparent substrate 12B was exposed in the pattern of the second conductive film 10B shown in FIGS. 7 and 13. The exposure was carried out using patterned photomasks and a parallel light from a light source of a high-pressure mercury lamp.

(Development Treatment)

The exposed photosensitive material was treated with the above treatment agents of First Example using an automatic processor FG-710PTS manufactured by FUJIFILM Corporation under the following conditions. A development treatment was carried out at 35° C. for 30 seconds, a fixation treatment was carried out at 34° C. for 23 seconds, and then a water washing treatment was carried out for 20 seconds at a water flow rate of 5 L/min.

Example 41

In the conductive film stack produced in Example 41, the small lattices 70 in the first conductive part 14A of the first conductive film 10A and the second conductive part 14B of the second conductive film 10B had an angle θ of 30° between the first side 70a (see FIG. 10) and the first direction (the x direction), a side length of 200 μm, and a line width of 6 μm.

Examples 42 to 44

The conductive film stacks of Examples 42, 43, and 44 were produced in the same manner as Example 41 except that the small lattices 70 had side lengths of 220, 240, and 400 μm respectively.

Example 45

In the conductive film stack produced in Example 45, the small lattices 70 had an angle θ of 32° between the first side 70a and the first direction, a side length of 200 μm, and a line width of 6 μm.

Examples 46 to 48

The conductive film stacks of Examples 46, 47, and 48 were produced in the same manner as Example 45 except that the small lattices 70 had side lengths of 220, 240, and 400 μm respectively.

Example 49

In the conductive film stack produced in Example 49, the small lattices 70 had an angle θ of 36° between the first side 70a and the first direction, a side length of 200 μm, and a line width of 6 μm.

Examples 50 to 52

The conductive film stacks of Examples 50, 51, and 52 were produced in the same manner as Example 49 except that the small lattices 70 had side lengths of 220, 240, and 400 μm respectively.

Example 53

In the conductive film stack produced in Example 53, the small lattices 70 had an angle θ of 37° between the first side 70a and the first direction, a side length of 200 μm, and a line width of 6 μm.

Examples 54 to 56

The conductive film stacks of Examples 54, 55, and 56 were produced in the same manner as Example 53 except that the small lattices 70 had side lengths of 220, 240, and 400 μm respectively.

Example 57

In the conductive film stack produced in Example 57, the small lattices 70 had an angle θ of 39° between the first side 70a and the first direction, a side length of 200 μm, and a line width of 6 μm.

Examples 58 to 60

The conductive film stacks of Examples 58, 59, and 60 were produced in the same manner as Example 57 except that the small lattices 70 had side lengths of 220, 240, and 400 μm respectively.

Example 61

In the conductive film stack produced in Example 61, the small lattices 70 had an angle θ of 40° between the first side 70a and the first direction, a side length of 200 μm, and a line width of 6 μm.

Examples 62 to 64

The conductive film stacks of Examples 62, 63, and 64 were produced in the same manner as Example 61 except that the small lattices 70 had side lengths of 220, 240, and 400 μm respectively.

Example 65

In the conductive film stack produced in Example 65, the small lattices 70 had an angle θ of 44° between the first side 70*a* and the first direction, a side length of 200 μm, and a line width of 6 μm.

Examples 66 to 68

The conductive film stacks of Examples 66, 67, and 68 were produced in the same manner as Example 65 except that the small lattices 70 had side lengths of 220, 240, and 400 μm respectively.

Example 69

In the conductive film stack produced in Example 69, the small lattices 70 had an angle θ of 45° between the first side 70*a* and the first direction, a side length of 200 μm, and a line width of 6 μm.

Examples 70 to 72

The conductive film stacks of Examples 70, 71, and 72 were produced in the same manner as Example 69 except that the small lattices 70 had side lengths of 220, 240, and 400 μm respectively.

Example 73

In the conductive film stack produced in Example 73, the small lattices 70 had an angle θ of 46° between the first side 70*a* and the first direction, a side length of 200 μm, and a line width of 6 μm.

Examples 74 to 76

The conductive film stacks of Examples 74, 75, and 76 were produced in the same manner as Example 73 except that the small lattices 70 had side lengths of 220, 240, and 400 μm respectively.

Example 77

In the conductive film stack produced in Example 77, the small lattices 70 had an angle θ of 50° between the first side 70*a* and the first direction, a side length of 200 μm, and a line width of 6 μm.

Examples 78 to 80

The conductive film stacks of Examples 78, 79, and 80 were produced in the same manner as Example 77 except that the small lattices 70 had side lengths of 220, 240, and 400 μm respectively.

Example 81

In the conductive film stack produced in Example 81, the small lattices 70 had an angle θ of 51° between the first side 70*a* and the first direction, a side length of 200 μm, and a line width of 6 μm.

Examples 82 to 84

The conductive film stacks of Examples 82, 83, and 84 were produced in the same manner as Example 81 except that the small lattices 70 had side lengths of 220, 240, and 400 μm respectively.

Example 85

In the conductive film stack produced in Example 85, the small lattices 70 had an angle θ of 53° between the first side 70*a* and the first direction, a side length of 200 μm, and a line width of 6 μm.

Examples 86 to 88

The conductive film stacks of Examples 86, 87, and 88 were produced in the same manner as Example 85 except that the small lattices 70 had side lengths of 220, 240, and 400 μm respectively.

Example 89

In the conductive film stack produced in Example 89, the small lattices 70 had an angle θ of 54° between the first side 70*a* and the first direction, a side length of 200 μm, and a line width of 6 μm.

Examples 90 to 92

The conductive film stacks of Examples 90, 91, and 92 were produced in the same manner as Example 89 except that the small lattices 70 had side lengths of 220, 240, and 400 μm respectively.

Example 93

In the conductive film stack produced in Example 93, the small lattices 70 had an angle θ of 58° between the first side 70*a* and the first direction, a side length of 200 μm, and a line width of 6 μm.

Examples 94 to 96

The conductive film stacks of Examples 94, 95, and 96 were produced in the same manner as Example 93 except that the small lattices 70 had side lengths of 220, 240, and 400 μm respectively.

Example 97

In the conductive film stack produced in Example 97, the small lattices 70 had an angle θ of 60° between the first side 70*a* and the first direction, a side length of 200 μm, and a line width of 6 μm.

Examples 98 to 100

The conductive film stacks of Examples 98, 99, and 100 were produced in the same manner as Example 97 except that the small lattices 70 had side lengths of 220, 240, and 400 μm respectively.

Comparative Example 11

In the conductive film stack produced in Comparative Example 11, the small lattices 70 had an angle θ of 29° between the first side 70a and the first direction, a side length of 200 μm, and a line width of 6 μm.

Comparative Examples 12 and 13

The conductive film stacks of Comparative Examples 12 and 13 were produced in the same manner as Comparative Example 11 except that the small lattices 70 had side lengths of 300 and 400 μm respectively.

Comparative Example 14

In the conductive film stack produced in Comparative Example 14, the small lattices 70 had an angle θ of 61° between the first side 70a and the first direction, a side length of 200 μm, and a line width of 6 μm.

Comparative Examples 15 and 16

The conductive film stacks of Comparative Examples 15 and 16 were produced in the same manner as Comparative Example 14 except that the small lattices 70 had side lengths of 300 and 400 μm respectively.

[Evaluation]

The opening ratio calculation and the moire evaluation of the conductive film stacks were carried out in the same manner as First Example. The results are shown in Tables 5 and 6.

TABLE 5

| | Small lattice | | | Display device | | | |
|---|---|---|---|---|---|---|---|
| | Angle | Side length (μm) | Line width (μm) | Horizontal pixel pitch Ph (μm) | Vertical pixel pitch Pv (μm) | Opening Ratio (%) | Moire evaluation |
| Comparative Example 11 | 29° | 200 | 6 | 192 | 192 | 94 | D |
| Comparative Example 12 | 29° | 300 | 6 | 192 | 192 | 96 | D |
| Comparative Example 13 | 29° | 400 | 6 | 192 | 192 | 97 | D |
| Example 41 | 30° | 200 | 6 | 192 | 192 | 94 | C |
| Example 42 | 30° | 220 | 6 | 192 | 192 | 95 | B |
| Example 43 | 30° | 240 | 6 | 192 | 192 | 95 | B |
| Example 44 | 30° | 400 | 6 | 192 | 192 | 97 | C |
| Example 45 | 32° | 200 | 6 | 192 | 192 | 94 | B |
| Example 46 | 32° | 220 | 6 | 192 | 192 | 95 | A |
| Example 47 | 32° | 240 | 6 | 192 | 192 | 95 | A |
| Example 48 | 32° | 400 | 6 | 192 | 192 | 97 | B |
| Example 49 | 36° | 200 | 6 | 192 | 192 | 94 | B |
| Example 50 | 36° | 220 | 6 | 192 | 192 | 95 | A |
| Example 51 | 36° | 240 | 6 | 192 | 192 | 95 | A |
| Example 52 | 36° | 400 | 6 | 192 | 192 | 97 | B |
| Example 53 | 37° | 200 | 6 | 192 | 192 | 94 | B |
| Example 54 | 37° | 220 | 6 | 192 | 192 | 95 | A |
| Example 55 | 37° | 240 | 6 | 192 | 192 | 95 | A |
| Example 56 | 37° | 400 | 6 | 192 | 192 | 97 | B |
| Example 57 | 39° | 200 | 6 | 192 | 192 | 94 | B |
| Example 58 | 39° | 220 | 6 | 192 | 192 | 95 | A |
| Example 59 | 39° | 240 | 6 | 192 | 192 | 95 | A |
| Example 60 | 39° | 400 | 6 | 192 | 192 | 97 | B |
| Example 61 | 40° | 200 | 6 | 192 | 192 | 94 | C |
| Example 62 | 40° | 220 | 6 | 192 | 192 | 95 | B |
| Example 63 | 40° | 240 | 6 | 192 | 192 | 95 | B |
| Example 64 | 40° | 400 | 6 | 192 | 192 | 97 | C |
| Example 65 | 44° | 200 | 6 | 192 | 192 | 94 | C |
| Example 66 | 44° | 220 | 6 | 192 | 192 | 95 | B |
| Example 67 | 44° | 240 | 6 | 192 | 192 | 95 | B |
| Example 68 | 44° | 400 | 6 | 192 | 192 | 97 | C |
| Example 69 | 45° | 200 | 6 | 192 | 192 | 94 | C |
| Example 70 | 45° | 220 | 6 | 192 | 192 | 95 | C |
| Example 71 | 45° | 240 | 6 | 192 | 192 | 95 | C |
| Example 72 | 45° | 400 | 6 | 192 | 192 | 97 | C |

TABLE 6

| | Small lattice | | | Display device | | | |
|---|---|---|---|---|---|---|---|
| | Angle | Side length (μm) | Line width (μm) | Horizontal pixel pitch Ph (μm) | Vertical pixel pitch Pv (μm) | Opening Ratio (%) | Moire evaluation |
| Example 73 | 46° | 200 | 6 | 192 | 192 | 94 | C |
| Example 74 | 46° | 220 | 6 | 192 | 192 | 96 | B |
| Example 75 | 46° | 240 | 6 | 192 | 192 | 97 | B |
| Example 76 | 46° | 400 | 6 | 192 | 192 | 94 | C |
| Example 77 | 50° | 200 | 6 | 192 | 192 | 95 | C |
| Example 78 | 50° | 220 | 6 | 192 | 192 | 95 | B |

TABLE 6-continued

|  | | Small lattice | | Display device | | | |
|---|---|---|---|---|---|---|---|
|  | Angle | Side length (μm) | Line width (μm) | Horizontal pixel pitch Ph (μm) | Vertical pixel pitch Pv (μm) | Opening Ratio (%) | Moire evaluation |
| Example 79 | 50° | 240 | 6 | 192 | 192 | 97 | B |
| Example 80 | 50° | 400 | 6 | 192 | 192 | 94 | C |
| Example 81 | 51° | 200 | 6 | 192 | 192 | 95 | B |
| Example 82 | 51° | 220 | 6 | 192 | 192 | 95 | A |
| Example 83 | 51° | 240 | 6 | 192 | 192 | 97 | A |
| Example 84 | 51° | 400 | 6 | 192 | 192 | 94 | B |
| Example 85 | 53° | 200 | 6 | 192 | 192 | 95 | B |
| Example 86 | 53° | 220 | 6 | 192 | 192 | 95 | A |
| Example 87 | 53° | 240 | 6 | 192 | 192 | 97 | A |
| Example 88 | 53° | 400 | 6 | 192 | 192 | 94 | B |
| Example 89 | 54° | 200 | 6 | 192 | 192 | 95 | B |
| Example 90 | 54° | 220 | 6 | 192 | 192 | 95 | A |
| Example 91 | 54° | 240 | 6 | 192 | 192 | 97 | A |
| Example 92 | 54° | 400 | 6 | 192 | 192 | 94 | B |
| Example 93 | 58° | 200 | 6 | 192 | 192 | 95 | B |
| Example 94 | 58° | 220 | 6 | 192 | 192 | 95 | A |
| Example 95 | 58° | 240 | 6 | 192 | 192 | 97 | A |
| Example 96 | 58° | 400 | 6 | 192 | 192 | 94 | B |
| Example 97 | 60° | 200 | 6 | 192 | 192 | 95 | C |
| Example 98 | 60° | 220 | 6 | 192 | 192 | 95 | B |
| Example 99 | 60° | 240 | 6 | 192 | 192 | 97 | B |
| Example 100 | 60° | 400 | 6 | 192 | 192 | 94 | C |
| Comparative Example 14 | 61° | 200 | 6 | 192 | 192 | 95 | D |
| Comparative Example 15 | 61° | 300 | 6 | 192 | 192 | 95 | D |
| Comparative Example 16 | 61° | 400 | 6 | 192 | 192 | 97 | D |

As shown in Tables 5 and 6, the conductive film stacks of Comparative Examples 11 to 16 were evaluated as D, and had highly visible moire. Of Examples 41 to 100, in Examples 41, 44, 61, 64, 65, 68 to 73, 76, 77, 80, 97, and 100, the moire was only slightly visible to an acceptable extent. In the other Examples, Examples 42, 43, 45, 48, 49, 52, 53, 56, 57, 60, 62, 63, 66, 67, 74, 75, 78, 79, 81, 84, 85, 88, 89, 92, 93, 96, 98, and 99 were desirable because the moire was hardly generated. In particular, in Examples 46, 47, 50, 51, 54, 55, 58, 59, 82, 83, 86, 87, 90, 91, 94, and 95, the moire generation was not observed because the small lattices 70 had an angle θ of 32° to 39° between the first side 70a and the first direction and a side length of 220 μm or 240 μm.

Projected capacitive touch panels 50 were produced using the conductive film stacks 54 of Examples 41 to 100 respectively. When the touch panels 50 were operated by a finger touch, they exhibited high response speeds and excellent detection sensitivities. Furthermore, when two or more points were touched, the touch panels 50 exhibited the same excellent properties. Thus, it was confirmed that the touch panels 50 were capable of multi-touch detection.

Third Example

In Third Example, conductive film stacks of Comparative Examples 21 to 26 and Examples 101 to 160 were produced respectively. The opening ratio of each conductive film stack was calculated, and the moire of each conductive film stack was evaluated. The components, calculation results, and evaluation results of Comparative Examples 21 to 26 and Examples 101 to 160 are shown in Tables 7 and 8.

Examples 101 to 160 and Comparative Examples 21 to 26

(Photosensitive Silver Halide Material)

A roll photosensitive silver halide material was prepared in the same manner as First Example.

(Exposure)

An A4 (210 mm×297 mm) sized area of the first transparent substrate 12A was exposed in the pattern of the first conductive film 10A shown in FIGS. 7 and 9, and an A4 sized area of the second transparent substrate 12B was exposed in the pattern of the second conductive film 10B shown in FIGS. 7 and 13. The exposure was carried out using patterned photomasks and a parallel light from a light source of a high-pressure mercury lamp.

(Development Treatment)

The exposed photosensitive material was treated with the above treatment agents of First Example using an automatic processor FG-710PTS manufactured by FUJIFILM Corporation under the following conditions. A development treatment was carried out at 35° C. for 30 seconds, a fixation treatment was carried out at 34° C. for 23 seconds, and then a water washing treatment was carried out for 20 seconds at a water flow rate of 5 L/min.

Example 101

In the conductive film stack produced in Example 101, the first large lattices 68A in the first conductive part 14A of the first conductive film 10A had an aspect ratio (Lva/Lha) of 0.5773, the second large lattices 68B in the second conductive part 14B of the second conductive film 10B had an aspect ratio (Lvb/Lhb) of 0.5773, and the thin metal wires 16 had a thin wire pitch Ps of 200 μm and a line width of 6 μm.

Examples 102 to 104

The conductive film stacks of Examples 102, 103, and 104 were produced in the same manner as Example 101 except that the thin metal wires 16 had thin wire pitches Ps of 220, 240, and 400 μm respectively.

Example 105

In the conductive film stack produced in Example 105, the first large lattices 68A and the second large lattices 68B had an aspect ratio of 0.6248, and the thin metal wires 16 had a thin wire pitch Ps of 200 μm and a line width of 6 μm.

Examples 106 to 108

The conductive film stacks of Examples 106, 107, and 108 were produced in the same manner as Example 105 except that the thin metal wires 16 had thin wire pitches Ps of 220, 240, and 400 μm respectively.

Example 109

In the conductive film stack produced in Example 109, the first large lattices 68A and the second large lattices 68B had an aspect ratio of 0.7266, and the thin metal wires 16 had a thin wire pitch Ps of 200 μm and a line width of 6 μm.

Examples 110 to 112

The conductive film stacks of Examples 110, 111, and 112 were produced in the same manner as Example 109 except that the thin metal wires 16 had thin wire pitches Ps of 220, 240, and 400 μm respectively.

Example 113

In the conductive film stack produced in Example 113, the first large lattices 68A and the second large lattices 68B had an aspect ratio of 0.7535, and the thin metal wires 16 had a thin wire pitch Ps of 200 μm and a line width of 6 μm.

Examples 114 to 116

The conductive film stacks of Examples 114, 115, and 116 were produced in the same manner as Example 113 except that the thin metal wires 16 had thin wire pitches Ps of 220, 240, and 400 μm respectively.

Example 117

In the conductive film stack produced in Example 117, the first large lattices 68A and the second large lattices 68B had an aspect ratio of 0.8098, and the thin metal wires 16 had a thin wire pitch Ps of 200 μm and a line width of 6 μm.

Examples 118 to 120

The conductive film stacks of Examples 118, 119, and 120 were produced in the same manner as Example 117 except that the thin metal wires 16 had thin wire pitches Ps of 220, 240, and 400 μm respectively.

Example 121

In the conductive film stack produced in Example 121, the first large lattices 68A and the second large lattices 68B had an aspect ratio of 0.8391, and the thin metal wires 16 had a thin wire pitch Ps of 200 μm and a line width of 6 μm.

Examples 122 to 124

The conductive film stacks of Examples 122, 123, and 124 were produced in the same manner as Example 121 except that the thin metal wires 16 had thin wire pitches Ps of 220, 240, and 400 μm respectively.

Example 125

In the conductive film stack produced in Example 125, the first large lattices 68A and the second large lattices 68B had an aspect ratio of 0.9657, and the thin metal wires 16 had a thin wire pitch Ps of 200 μm and a line width of 6 μm.

Examples 126 to 128

The conductive film stacks of Examples 126, 127, and 128 were produced in the same manner as Example 125 except that the thin metal wires 16 had thin wire pitches Ps of 220, 240, and 400 μm respectively.

Example 129

In the conductive film stack produced in Example 129, the first large lattices 68A and the second large lattices 68B had an aspect ratio of 1.0000, and the thin metal wires 16 had a thin wire pitch Ps of 200 μm and a line width of 6 μm.

Examples 130 to 132

The conductive film stacks of Examples 130, 131, and 132 were produced in the same manner as Example 129 except that the thin metal wires 16 had thin wire pitches Ps of 220, 240, and 400 μm respectively.

Example 133

In the conductive film stack produced in Example 133, the first large lattices 68A and the second large lattices 68B had an aspect ratio of 1.0356, and the thin metal wires 16 had a thin wire pitch Ps of 200 μm and a line width of 6 μm.

Examples 134 to 136

The conductive film stacks of Examples 134, 135, and 136 were produced in the same manner as Example 133 except that the thin metal wires 16 had thin wire pitches Ps of 220, 240, and 400 μm respectively.

Example 137

In the conductive film stack produced in Example 137, the first large lattices 68A and the second large lattices 68B had an aspect ratio of 1.1917, and the thin metal wires 16 had a thin wire pitch Ps of 200 μm and a line width of 6 μm.

Examples 138 to 140

The conductive film stacks of Examples 138, 139, and 140 were produced in the same manner as Example 137 except that the thin metal wires 16 had thin wire pitches Ps of 220, 240, and 400 μm respectively.

Example 141

In the conductive film stack produced in Example 141, the first large lattices 68A and the second large lattices 68B had an aspect ratio of 1.2349, and the thin metal wires 16 had a thin wire pitch Ps of 200 µm and a line width of 6 µm.

Examples 142 to 144

The conductive film stacks of Examples 142, 143, and 144 were produced in the same manner as Example 141 except that the thin metal wires 16 had thin wire pitches Ps of 220, 240, and 400 µm respectively.

Example 145

In the conductive film stack produced in Example 145, the first large lattices 68A and the second large lattices 68B had an aspect ratio of 1.3271, and the thin metal wires 16 had a thin wire pitch Ps of 200 µm and a line width of 6 µm.

Examples 146 to 148

The conductive film stacks of Examples 146, 147, and 148 were produced in the same manner as Example 145 except that the thin metal wires 16 had thin wire pitches Ps of 220, 240, and 400 µm respectively.

Example 149

In the conductive film stack produced in Example 149, the first large lattices 68A and the second large lattices 68B had an aspect ratio of 1.3763, and the thin metal wires 16 had a thin wire pitch Ps of 200 µm and a line width of 6 µm.

Examples 150 to 152

The conductive film stacks of Examples 150, 151, and 152 were produced in the same manner as Example 153 except that the thin metal wires 16 had thin wire pitches Ps of 220, 240, and 400 µm respectively.

Example 153

In the conductive film stack produced in Example 153, the first large lattices 68A and the second large lattices 68B had an aspect ratio of 1.6004, and the thin metal wires 16 had a thin wire pitch Ps of 200 µm and a line width of 6 µm.

Examples 154 to 156

The conductive film stacks of Examples 154, 155, and 156 were produced in the same manner as Example 149 except that the thin metal wires 16 had thin wire pitches Ps of 220, 240, and 400 µm respectively.

Example 157

In the conductive film stack produced in Example 157, the first large lattices 68A and the second large lattices 68B had an aspect ratio of 1.7321, and the thin metal wires 16 had a thin wire pitch Ps of 200 µm and a line width of 6 µm.

Examples 158 to 160

The conductive film stacks of Examples 158, 159, and 160 were produced in the same manner as Example 157 except that the thin metal wires 16 had thin wire pitches Ps of 220, 240, and 400 µm respectively.

Comparative Example 21

In the conductive film stack produced in Comparative Example 21, the first large lattices 68A and the second large lattices 68B had an aspect ratio of 0.5543, and the thin metal wires 16 had a thin wire pitch Ps of 200 µm and a line width of 6 µm.

Comparative Examples 22 and 23

The conductive film stacks of Comparative Example 22 and 23 were produced in the same manner as Comparative Example 21 except that the thin metal wires 16 had thin wire pitches Ps of 300 and 400 µm respectively.

Comparative Example 24

In the conductive film stack produced in Comparative Example 24, the first large lattices 68A and the second large lattices 68B had an aspect ratio of 1.8040, and the thin metal wires 16 had a thin wire pitch Ps of 200 µm and a line width of 6 µm.

Comparative Examples 25 and 26

The conductive film stacks of Comparative Example 25 and 26 were produced in the same manner as Comparative Example 24 except that the thin metal wires 16 had thin wire pitches Ps of 300 and 400 µm respectively.

[Evaluation]

The opening ratio calculation and the moire evaluation of the conductive film stacks were carried out in the same manner as First Example. The results are shown in Tables 7 and 8.

TABLE 7

| | Large lattice | | | Display device | | | |
|---|---|---|---|---|---|---|---|
| | Aspect ratio | Pitch Ps (µm) | Line width (µm) | Horizontal pixel pitch Ph (µm) | Vertical pixel pitch Pv (µm) | Opening Ratio (%) | Moire evaluation |
| Comparative Example 21 | 0.5543 | 200 | 6 | 192 | 192 | 94 | D |
| Comparative Example 22 | 0.5543 | 300 | 6 | 192 | 192 | 96 | D |
| Comparative Example 23 | 0.5543 | 400 | 6 | 192 | 192 | 97 | D |
| Example 101 | 0.5773 | 200 | 6 | 192 | 192 | 94 | C |
| Example 102 | 0.5773 | 220 | 6 | 192 | 192 | 95 | B |
| Example 103 | 0.5773 | 240 | 6 | 192 | 192 | 95 | B |
| Example 104 | 0.5773 | 400 | 6 | 192 | 192 | 97 | C |
| Example 105 | 0.6248 | 200 | 6 | 192 | 192 | 94 | B |
| Example 106 | 0.6248 | 220 | 6 | 192 | 192 | 95 | A |

TABLE 7-continued

|  | Large lattice | | | Display device | | | |
|---|---|---|---|---|---|---|---|
|  | Aspect ratio | Pitch Ps (μm) | Line width (μm) | Horizontal pixel pitch Ph (μm) | Vertical pixel pitch Pv (μm) | Opening Ratio (%) | Moire evaluation |
| Example 107 | 0.6248 | 240 | 6 | 192 | 192 | 95 | A |
| Example 108 | 0.6248 | 400 | 6 | 192 | 192 | 97 | B |
| Example 109 | 0.7266 | 200 | 6 | 192 | 192 | 94 | B |
| Example 110 | 0.7266 | 220 | 6 | 192 | 192 | 95 | A |
| Example 111 | 0.7266 | 240 | 6 | 192 | 192 | 95 | A |
| Example 112 | 0.7266 | 400 | 6 | 192 | 192 | 97 | B |
| Example 113 | 0.7535 | 200 | 6 | 192 | 192 | 94 | B |
| Example 114 | 0.7535 | 220 | 6 | 192 | 192 | 95 | A |
| Example 115 | 0.7535 | 240 | 6 | 192 | 192 | 95 | A |
| Example 116 | 0.7535 | 400 | 6 | 192 | 192 | 97 | B |
| Example 117 | 0.8098 | 200 | 6 | 192 | 192 | 94 | B |
| Example 118 | 0.8098 | 220 | 6 | 192 | 192 | 95 | A |
| Example 119 | 0.8098 | 240 | 6 | 192 | 192 | 95 | A |
| Example 120 | 0.8098 | 400 | 6 | 192 | 192 | 97 | B |
| Example 121 | 0.8391 | 200 | 6 | 192 | 192 | 94 | C |
| Example 122 | 0.8391 | 220 | 6 | 192 | 192 | 95 | B |
| Example 123 | 0.8391 | 240 | 6 | 192 | 192 | 95 | B |
| Example 124 | 0.8391 | 400 | 6 | 192 | 192 | 97 | C |
| Example 125 | 0.9657 | 200 | 6 | 192 | 192 | 94 | C |
| Example 126 | 0.9657 | 220 | 6 | 192 | 192 | 95 | B |
| Example 127 | 0.9657 | 240 | 6 | 192 | 192 | 95 | B |
| Example 128 | 0.9657 | 400 | 6 | 192 | 192 | 97 | C |
| Example 129 | 1.0000 | 200 | 6 | 192 | 192 | 94 | C |
| Example 130 | 1.0000 | 220 | 6 | 192 | 192 | 95 | C |
| Example 131 | 1.0000 | 240 | 6 | 192 | 192 | 95 | C |
| Example 132 | 1.0000 | 400 | 6 | 192 | 192 | 97 | C |

TABLE 8

|  | Large lattice | | | Display device | | | |
|---|---|---|---|---|---|---|---|
|  | Aspect ratio | Pitch Ps (μm) | Line width (μm) | Horizontal pixel pitch Ph (μm) | Vertical pixel pitch Pv (μm) | Opening Ratio (%) | Moire evaluation |
| Example 133 | 1.0356 | 200 | 6 | 192 | 192 | 94 | C |
| Example 134 | 1.0356 | 220 | 6 | 192 | 192 | 96 | B |
| Example 135 | 1.0356 | 240 | 6 | 192 | 192 | 97 | B |
| Example 136 | 1.0356 | 400 | 6 | 192 | 192 | 94 | C |
| Example 137 | 1.1917 | 200 | 6 | 192 | 192 | 95 | C |
| Example 138 | 1.1917 | 220 | 6 | 192 | 192 | 95 | B |
| Example 139 | 1.1917 | 240 | 6 | 192 | 192 | 97 | B |
| Example 140 | 1.1917 | 400 | 6 | 192 | 192 | 94 | C |
| Example 141 | 1.2349 | 200 | 6 | 192 | 192 | 95 | B |
| Example 142 | 1.2349 | 220 | 6 | 192 | 192 | 95 | A |
| Example 143 | 1.2349 | 240 | 6 | 192 | 192 | 97 | A |
| Example 144 | 1.2349 | 400 | 6 | 192 | 192 | 94 | B |
| Example 145 | 1.3271 | 200 | 6 | 192 | 192 | 95 | B |
| Example 146 | 1.3271 | 220 | 6 | 192 | 192 | 95 | A |
| Example 147 | 1.3271 | 240 | 6 | 192 | 192 | 97 | A |
| Example 148 | 1.3271 | 400 | 6 | 192 | 192 | 94 | B |
| Example 149 | 1.3763 | 200 | 6 | 192 | 192 | 95 | B |
| Example 150 | 1.3763 | 220 | 6 | 192 | 192 | 95 | A |
| Example 151 | 1.3763 | 240 | 6 | 192 | 192 | 97 | A |
| Example 152 | 1.3763 | 400 | 6 | 192 | 192 | 94 | B |
| Example 153 | 1.6004 | 200 | 6 | 192 | 192 | 95 | B |
| Example 154 | 1.6004 | 220 | 6 | 192 | 192 | 95 | A |
| Example 155 | 1.6004 | 240 | 6 | 192 | 192 | 97 | A |
| Example 156 | 1.6004 | 400 | 6 | 192 | 192 | 94 | B |
| Example 157 | 1.7321 | 200 | 6 | 192 | 192 | 95 | C |
| Example 158 | 1.7321 | 220 | 6 | 192 | 192 | 95 | B |
| Example 159 | 1.7321 | 240 | 6 | 192 | 192 | 97 | B |
| Example 160 | 1.7321 | 400 | 6 | 192 | 192 | 94 | C |
| Comparative Example 24 | 1.8040 | 200 | 6 | 192 | 192 | 95 | D |
| Comparative Example 25 | 1.8040 | 300 | 6 | 192 | 192 | 95 | D |
| Comparative Example 26 | 1.8040 | 400 | 6 | 192 | 192 | 97 | D |

As shown in Tables 7 and 8, the conductive film stacks of Comparative Examples 21 to 26 were evaluated as D, and had highly visible moire. Of Examples 101 to 160, in Examples 101, 104, 121, 124, 125, 128 to 133, 136, 137, 140, 157, and 160, the moire was only slightly visible to an acceptable extent. In the other Examples, Examples 102, 103, 105, 108, 109, 112, 113, 116, 117, 120, 122, 123, 126, 127, 134, 135, 138, 139, 141, 144, 145, 148, 149, 152, 153, 156, 158, and 159 were desirable because the moire was hardly generated. In particular, in Examples 106, 107, 110, 111, 114, 115, 118, 119, 142, 143, 146, 147, 150, 151, 154, and 155, the moire generation was not observed because the aspect ratio of the first large lattices 68A and the second large lattices 68B was more than 0.62 and less than 0.81, or more than 1.23 and less than 1.61, and the thin metal wires 16 had a thin wire pitch Ps of 220 μm or 240 μm.

Projected capacitive touch panels 50 were produced using the conductive film stacks 54 of Examples 101 to 160 respectively. When the touch panels 50 were operated by a finger touch, they exhibited high response speeds and excellent detection sensitivities. Furthermore, when two or more points were touched, the touch panels 50 exhibited the same excellent properties. Thus, it was confirmed that the touch panels 50 were capable of multi-touch detection.

Fourth Example

In Fourth Example, conductive film stacks of Comparative Examples 31 to 36 and Examples 161 to 220 were produced respectively. The opening ratio of each conductive film stack was calculated, and the moire of each conductive film stack was evaluated. The components, calculation results, and evaluation results of Comparative Examples 31 to 36 and Examples 161 to 220 are shown in Tables 9 and 10.

Examples 161 to 220 and Comparative Examples 31 to 36

The conductive film stacks were produced and evaluated in the same manner as Third Example except that the first conductive film 110A was exposed in the pattern shown in FIG. 19 and the second conductive film 110B was exposed in the pattern shown in FIG. 20. The aspect ratio of the rhombus formed between the two first upper bases 126A arranged in the horizontal direction was considered as the aspect ratio of the first large lattice 118A in the first conductive part 114A of the first conductive film 110A, and the aspect ratio of the rhombus formed between the two horizontally extending corners was considered as the aspect ratio of the second large lattice 118B in the second conductive part 114B of the second conductive film 110B.

Example 161

In the conductive film stack produced in Example 161, the first large lattices 118A in the first conductive part 114A of the first conductive film 110A had an aspect ratio (Lva/Lha) of 0.5773, the second large lattices 118B in the second conductive part 114B of the second conductive film 110B had an aspect ratio (Lvb/Lhb) of 0.5773, and the thin metal wires 16 had a thin wire pitch Ps of 200 μm and a line width of 6 μm.

Examples 162 to 220 and Comparative Examples 31 to 36

The conductive film stacks of Examples 162 to 220 were produced in the same manner as Examples 102 to 160 of Third Example respectively. The conductive film stacks of Comparative Examples 31 to 36 were produced in the same manner as Comparative Examples 21 to 26 of Third Example respectively.

TABLE 9

| | Large lattice | | | Display device | | | |
|---|---|---|---|---|---|---|---|
| | Aspect ratio | Pitch Ps (μm) | Line width (μm) | Horizontal pixel pitch Ph (μm) | Vertical pixel pitch Pv (μm) | Opening Ratio (%) | Moire evaluation |
| Comparative Example 31 | 0.5543 | 200 | 6 | 192 | 192 | 95 | D |
| Comparative Example 32 | 0.5543 | 300 | 6 | 192 | 192 | 96 | D |
| Comparative Example 33 | 0.5543 | 400 | 6 | 192 | 192 | 97 | D |
| Example 161 | 0.5773 | 200 | 6 | 192 | 192 | 94 | C |
| Example 162 | 0.5773 | 220 | 6 | 192 | 192 | 94 | B |
| Example 163 | 0.5773 | 240 | 6 | 192 | 192 | 95 | B |
| Example 164 | 0.5773 | 400 | 6 | 192 | 192 | 97 | B |
| Example 165 | 0.6248 | 200 | 6 | 192 | 192 | 94 | B |
| Example 166 | 0.6248 | 220 | 6 | 192 | 192 | 95 | A |
| Example 167 | 0.6248 | 240 | 6 | 192 | 192 | 95 | A |
| Example 168 | 0.6248 | 400 | 6 | 192 | 192 | 97 | B |
| Example 169 | 0.7266 | 200 | 6 | 192 | 192 | 95 | B |
| Example 170 | 0.7266 | 220 | 6 | 192 | 192 | 95 | A |
| Example 171 | 0.7266 | 240 | 6 | 192 | 192 | 95 | A |
| Example 172 | 0.7266 | 400 | 6 | 192 | 192 | 97 | B |
| Example 173 | 0.7535 | 200 | 6 | 192 | 192 | 94 | B |
| Example 174 | 0.7535 | 220 | 6 | 192 | 192 | 95 | A |
| Example 175 | 0.7535 | 240 | 6 | 192 | 192 | 96 | A |
| Example 176 | 0.7535 | 400 | 6 | 192 | 192 | 97 | B |
| Example 177 | 0.8098 | 200 | 6 | 192 | 192 | 95 | B |
| Example 178 | 0.8098 | 220 | 6 | 192 | 192 | 95 | A |
| Example 179 | 0.8098 | 240 | 6 | 192 | 192 | 95 | A |
| Example 180 | 0.8098 | 400 | 6 | 192 | 192 | 97 | B |
| Example 181 | 0.8391 | 200 | 6 | 192 | 192 | 94 | C |
| Example 182 | 0.8391 | 220 | 6 | 192 | 192 | 95 | B |

TABLE 9-continued

|  | Large lattice | | | Display device | | | |
|---|---|---|---|---|---|---|---|
|  | Aspect ratio | Pitch Ps (μm) | Line width (μm) | Horizontal pixel pitch Ph (μm) | Vertical pixel pitch Pv (μm) | Opening Ratio (%) | Moire evaluation |
| Example 183 | 0.8391 | 240 | 6 | 192 | 192 | 95 | B |
| Example 184 | 0.8391 | 400 | 6 | 192 | 192 | 97 | C |
| Example 185 | 0.9657 | 200 | 6 | 192 | 192 | 94 | C |
| Example 186 | 0.9657 | 220 | 6 | 192 | 192 | 95 | B |
| Example 187 | 0.9657 | 240 | 6 | 192 | 192 | 96 | B |
| Example 188 | 0.9657 | 400 | 6 | 192 | 192 | 97 | C |
| Example 189 | 1.0000 | 200 | 6 | 192 | 192 | 94 | C |
| Example 190 | 1.0000 | 220 | 6 | 192 | 192 | 95 | B |
| Example 191 | 1.0000 | 240 | 6 | 192 | 192 | 95 | B |
| Example 192 | 1.0000 | 400 | 6 | 192 | 192 | 97 | C |

TABLE 10

|  | Large lattice | | | Display device | | | |
|---|---|---|---|---|---|---|---|
|  | Aspect ratio | Pitch Ps (μm) | Line width (μm) | Horizontal pixel pitch Ph (μm) | Vertical pixel pitch Pv (μm) | Opening Ratio (%) | Moire evaluation |
| Example 193 | 1.0356 | 200 | 6 | 192 | 192 | 95 | C |
| Example 194 | 1.0356 | 220 | 6 | 192 | 192 | 96 | B |
| Example 195 | 1.0356 | 240 | 6 | 192 | 192 | 97 | B |
| Example 196 | 1.0356 | 400 | 6 | 192 | 192 | 94 | B |
| Example 197 | 1.1917 | 200 | 6 | 192 | 192 | 95 | B |
| Example 198 | 1.1917 | 220 | 6 | 192 | 192 | 95 | B |
| Example 199 | 1.1917 | 240 | 6 | 192 | 192 | 97 | B |
| Example 200 | 1.1917 | 400 | 6 | 192 | 192 | 94 | C |
| Example 201 | 1.2349 | 200 | 6 | 192 | 192 | 95 | B |
| Example 202 | 1.2349 | 220 | 6 | 192 | 192 | 96 | A |
| Example 203 | 1.2349 | 240 | 6 | 192 | 192 | 97 | A |
| Example 204 | 1.2349 | 400 | 6 | 192 | 192 | 94 | B |
| Example 205 | 1.3271 | 200 | 6 | 192 | 192 | 95 | B |
| Example 206 | 1.3271 | 220 | 6 | 192 | 192 | 95 | A |
| Example 207 | 1.3271 | 240 | 6 | 192 | 192 | 97 | A |
| Example 208 | 1.3271 | 400 | 6 | 192 | 192 | 94 | B |
| Example 209 | 1.3763 | 200 | 6 | 192 | 192 | 95 | B |
| Example 210 | 1.3763 | 220 | 6 | 192 | 192 | 95 | A |
| Example 211 | 1.3763 | 240 | 6 | 192 | 192 | 97 | A |
| Example 212 | 1.3763 | 400 | 6 | 192 | 192 | 95 | B |
| Example 213 | 1.6004 | 200 | 6 | 192 | 192 | 95 | B |
| Example 214 | 1.6004 | 220 | 6 | 192 | 192 | 96 | A |
| Example 215 | 1.6004 | 240 | 6 | 192 | 192 | 97 | A |
| Example 216 | 1.6004 | 400 | 6 | 192 | 192 | 94 | B |
| Example 217 | 1.7321 | 200 | 6 | 192 | 192 | 95 | C |
| Example 218 | 1.7321 | 220 | 6 | 192 | 192 | 94 | B |
| Example 219 | 1.7321 | 240 | 6 | 192 | 192 | 97 | B |
| Example 220 | 1.7321 | 400 | 6 | 192 | 192 | 94 | C |
| Comparative Example 34 | 1.8040 | 200 | 6 | 192 | 192 | 95 | D |
| Comparative Example 35 | 1.8040 | 300 | 6 | 192 | 192 | 94 | D |
| Comparative Example 36 | 1.8040 | 400 | 6 | 192 | 192 | 97 | D |

As shown in Tables 9 and 10, the conductive film stacks of Comparative Examples 31 to 36 were evaluated as D, and had highly visible moire. Of Examples 161 to 220, in Examples 161, 181, 184, 185, 188, 189, 192, 193, 200, 217, and 220, the moire was only slightly visible to an acceptable extent. In the other Examples, Examples 162 to 165, 168, 169, 172, 173, 176, 177, 180, 182, 183, 186, 187, 190, 191, 194 to 199, 201, 204, 205, 208, 209, 212, 213, 216, 218, and 219 were desirable because the moire was hardly generated. In particular, in Examples 166, 167, 170, 171, 174, 175, 178, 179, 202, 203, 206, 207, 210, 211, 214, and 215, the moire generation was not observed because the aspect ratio of the first large lattices 118A and the second large lattices 118B was more than 0.62 and less than 0.81, or more than 1.23 and less than 1.61, and the thin metal wires 16 had a thin wire pitch Ps of 220 μm or 240 μm.

Projected capacitive touch panels 50 were produced using the conductive film stacks 104 of Examples 161 to 220 respectively. When the touch panels 50 were operated by a finger touch, they exhibited high response speeds and excellent detection sensitivities. Furthermore, when two or more points were touched, the touch panels 50 exhibited the same excellent properties. Thus, it was confirmed that the touch panels 50 were capable of multi-touch detection.

It is to be understood that the conductive film and the display device of the present invention are not limited to the above embodiments, and various changes and modifications may be made therein without departing from the scope of the present invention.

The invention claimed is:

1. A conductive film comprising,
a substrate, and
a conductive part disposed on one main surface of the substrate, wherein
the conductive part contains two or more conductive patterns composed of a thin metal wire,
the conductive patterns extend in a first direction and are arranged in a second direction perpendicular to the first direction,
the conductive patterns each contain two large lattices formed with a combination of two or more small lattices, wherein the two large lattices are electrically joined in the first direction with a medium lattice, and the medium lattice has a length of at least two small lattices extended in a first oblique direction, and the medium lattice has a width less than the length,
the small lattices each have a rhombic shape,
at least one side of each small lattice is at an angle of 32° to 44° or 46° to 58° with respect to the first direction, and
at least one vertex angle of each small lattice is twice an angle that is formed by the one side and the first direction.

2. The conductive film according to claim 1, wherein at least one side of each small lattice is at an angle of 32° to 39° with respect to the first direction.

3. The conductive film according to claim 1, wherein at least one side of each small lattice is at an angle of 51° to 58° with respect to the first direction.

4. The conductive film according to claim 1,
wherein each of the small lattices is formed on only the one main surface of the substrate.

5. The conductive film according to claim 1, wherein a side length of each small lattice is 100 to 400 µm.

6. The conductive film according to claim 1, wherein a line width of the thin metal wire is 30 µm or less.

7. The conductive film according to claim 1, wherein the medium lattice has a rectangular shape.

8. The conductive film according to claim 7, wherein the medium lattice does not contain a smaller lattice therein.

9. A conductive film comprising:
a substrate,
a first conductive part disposed on one main surface of the substrate, and
a second conductive part disposed on another main surface of the substrate, wherein
the first conductive part contains two or more first conductive patterns,
the first conductive patterns extend in a first direction and are arranged in a second direction perpendicular to the first direction and, wherein the first conductive patterns each contain two large lattices, wherein the large lattices each contain at least two small lattices, and the two large lattices are connected in series in the first direction,
wherein the two large lattices are electrically joined in the first direction with a medium lattice, and the medium lattice has a length of at least two small lattices extended in a first oblique direction, and the medium lattice has a width less than the length,
the second conductive part contains two or more second conductive patterns,
the second conductive patterns extend in the second direction and are arranged in the first direction,
the second conductive patterns each contain a combination of two or more small lattices,
the small lattices each have a rhombic shape,
at least one side of each small lattice is at an angle of 30° to 44° or 46° to 60° with respect to the first direction,
at least one vertex angle of each small lattice is twice an angle that is formed by the one side and the first direction.

10. The conductive film according to claim 9, wherein at least one side of each small lattice is at an angle of 32° to 39° with respect to the first direction.

11. The conductive film according to claim 9, wherein at least one side of each small lattice is at an angle of 51° to 58° with respect to the first direction.

12. The conductive film according to claim 9,
the second conductive patterns each contain two or more second large lattices connected in series in the second direction,
the second large lattices each contain a combination of two or more small lattices.

13. The conductive film according to claim 9, wherein a side length of each small lattice is 100 to 400 µm.

14. The conductive film according to claim 9, wherein a line width of the thin metal wire is 30 µm or less.

15. A conductive film comprising,
a substrate,
a conductive part disposed on one main surface of the substrate, wherein
the conductive part contains at least two mesh patterns having openings,
the openings having a rhombic shape, and
a vertex angle of the rhombic shape has angles of 64° to 88° or 92° to 116°,
wherein the two mesh patterns are electrically joined by a medium lattice, and the medium lattice has a length of at least two openings, and the medium lattice has a width less than the length.

16. A display device comprising
a display panel and
a conductive film disposed thereon, wherein
the conductive film includes
a substrate, and
a conductive part disposed on one main surface of the substrate, wherein
a first direction is an arrangement direction of pixels in the display device,
the conductive part contains two or more conductive patterns composed of a thin metal wire,
the conductive patterns extend in the first direction and are arranged in a second direction perpendicular to the first direction,
the conductive patterns each contain a combination of two or more small lattices,
the small lattices each have a rhombic shape,
at least one side of each small lattice is at an angle of 30° to 44° or 46° to 60° with respect to the first direction, and
at least one vertex angle of each small lattice is twice an angle that is formed by the one side and the first direction,
wherein the conductive patterns include two large lattices formed from the small lattices, and the two large lattices are electrically joined with a medium lattice, and the medium lattice has a length of at least two small lattices extended in a first oblique direction, and the medium lattice has a width less than the length.

17. The display device according to claim 16, wherein a side length of each small lattice is 100 to 400 μm.

18. The display device according to claim 16, wherein a line width of the thin metal wire is 30 μm or less.

19. A display device comprising
a display panel and
a conductive film disposed thereon, wherein
the conductive film includes
a substrate,
a first conductive part disposed on one main surface of the substrate, and
a second conductive part disposed on another main surface of the substrate, wherein
a first direction is an arrangement direction of pixels in the display device,
the first conductive part contains two or more first conductive patterns,
the first conductive patterns extend in a first direction and are arranged in a second direction perpendicular to the first direction,
the second conductive part contains two or more second conductive patterns,
the second conductive patterns extend in the second direction and are arranged in the first direction,
the first conductive patterns and the second conductive patterns each contain a combination of two or more small lattices,
the small lattices each have a rhombic shape,
at least one side of each small lattice is at an angle of 30° to 44° or 46° to 60° with respect to the first direction, and
at least one vertex angle of each small lattice is twice an angle that is formed by the one side and the first direction
wherein the two or more first conductive patterns of the first conductive part are electrically joined with a medium lattice, and the medium lattice has a length of at least two small lattices extended in a first oblique direction, and the medium lattice has a width less than the length.

20. The display device according to claim 19, wherein a side length of each small lattice is 100 to 400 μm.

21. The display device according to claim 19, wherein a line width of the thin metal wire is 30 μm or less.

22. A conductive film stack formed by laminating a first conductive film and a second conductive film, wherein
the first conductive film includes
a first transparent substrate, and
a first conductive part disposed on one main surface of the first transparent substrate, and
the second conductive film includes
a second transparent substrate, and
a second conductive part disposed on one main surface of the second transparent substrate,
the first conductive part contains two or more first conductive patterns,
the first conductive patterns extend in a first direction and are arranged in a second direction perpendicular to the first direction,
the second conductive part contains two or more second conductive patterns,
the second conductive patterns extend in the second direction and are arranged in the first direction,
the first conductive patterns and the second conductive patterns each contain a combination of two or more small lattices,
the small lattices each have a rhombic shape,
at least one side of each small lattice is at an angle of 30° to 44° or 46° to 60° with respect to the first direction, and
at least one vertex angle of each small lattice is twice an angle that is formed by the one side and the first direction,
wherein the first conductive patterns include two large lattices formed from the small lattices, and the two large lattices are electrically joined with a medium lattice, and the medium lattice has a length of at least two small lattices extended in a first oblique direction, and the medium lattice has a width less than the length.

23. A display device comprising
a display panel and
a conductive film stack formed by laminating a first conductive film and a second conductive film disposed on the display panel, wherein
the first conductive film includes
a first transparent substrate, and
a first conductive part disposed on one main surface of the first transparent substrate, and
the second conductive film includes
a second transparent substrate, and
a second conductive part disposed on one main surface of the second transparent substrate,
a first direction is an arrangement direction of pixels in the display device,
the first conductive part contains two or more first conductive patterns,
the first conductive patterns extend in the first direction and are arranged in a second direction perpendicular to the first direction,
the second conductive part contains two or more second conductive patterns,
the second conductive patterns extend in the second direction and are arranged in the first direction,
the first conductive patterns and the second conductive patterns each contain a combination of two or more small lattices,
the small lattices each have a rhombic shape,
at least one side of each small lattice is at an angle of 30° to 44° or 46° to 60° with respect to the first direction, and
at least one vertex angle of each small lattice is twice an angle that is formed by the one side and the first direction
wherein the first conductive patterns include two large lattices formed from the small lattices, and the two large lattices are electrically joined with a medium lattice, and the medium lattice has a length of at least two small lattices extended in a first oblique direction, and the medium lattice has a width less than the length.

* * * * *